(12) United States Patent
Choi et al.

(10) Patent No.: US 8,339,765 B2
(45) Date of Patent: Dec. 25, 2012

(54) CAPACITOR

(75) Inventors: Hoon-Sang Choi, Seoul (KR); Ki-Vin Im, Seongnam-si (KR); Se-Hoon Oh, Hwaseong-si (KR); Sang-Yeol Kang, Seoul (KR); Cha-Young Yoo, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 489 days.

(21) Appl. No.: 12/628,598

(22) Filed: Dec. 1, 2009

(65) Prior Publication Data

US 2010/0134950 A1 Jun. 3, 2010

(30) Foreign Application Priority Data

Dec. 1, 2008 (KR) ........................ 10-2008-0120358

(51) Int. Cl.
*H01G 4/30* (2006.01)
(52) U.S. Cl. .................. 361/301.4; 361/301.2; 361/303; 361/305; 361/306.2; 361/312
(58) Field of Classification Search ............... 361/301.2, 361/301.4, 311–313, 306.2, 306.1, 303–305; 438/295–296, 253
See application file for complete search history.

(56) References Cited

U.S. PATENT DOCUMENTS

| 7,183,603 B2 * | 2/2007 | Park .............................. 257/298 |
| 2006/0073670 A1 * | 4/2006 | Bae et al. ..................... 438/396 |

FOREIGN PATENT DOCUMENTS

| JP | 2006-216649 | 8/2006 |
| KR | 1020040052326 | 6/2004 |
| KR | 10-0532420 | 8/2004 |

* cited by examiner

*Primary Examiner* — Nguyen T Ha
(74) *Attorney, Agent, or Firm* — F. Chau & Associates, LLC.

(57) ABSTRACT

A capacitor includes a substrate, a plurality of first storage electrodes, a plurality of second storage electrodes, a first supporting layer pattern, a dielectric layer and a plate electrode. A plurality of contact pads is formed I the substrate. The first storage electrodes are arranged along lines parallel with a first direction and electrically connected to the contact pads, respectively. The second storage electrodes are respectively stacked on the first storage electrodes. The first supporting layer pattern extends in a direction parallel with the first direction between adjacent second storage electrodes and makes contact with the adjacent second storage electrodes to support the second storage electrodes. The dielectric layer is formed on the first and second storage electrodes. The plate electrode is formed on the dielectric layer.

9 Claims, 22 Drawing Sheets

SECOND
DIRECTION

FIRST
DIRECTION

SECOND DIRECTION
FIRST DIRECTION

SECOND        FIRST
DIRECTION     DIRECTION

CAPACITOR

CROSS-REFERENCE TO RELATED PATENT APPLICATION

This application claims priority under 35 U.S.C. §119 to Korean Patent Application No. 2008-0120358, filed on Dec. 1, 2008 in the Korean Intellectual Property Office (KIPO), the contents of which are herein incorporated by reference in their entirety.

BACKGROUND

1. Field

Example embodiments relate to a capacitor and a method of forming the capacitor. More particularly, example embodiments relate to a capacitor having lower electrodes stacked on each other and a method of forming the same.

2. Discussion of the Related Art

As semiconductor devices are highly integrated, a size of a unit cell of the semiconductor device is greatly reduced. However, a capacitor formed in the reduced unit cell is required to have a relatively high capacitance. Accordingly, in order to meet a required high capacitance in a unit cell of reduced size, various capacitor structures capable of increasing an effective area of an electrode included in the capacitor have been researched. Examples of the capacitor structures may be a planar type capacitor, a stack type or trench type capacitor, a cylinder type capacitor, etc.

However, when a height of a lower electrode of the cylinder type capacitor is increased, the lower electrode may incline or slant due to an unstable shape of the lower electrode. As a result, adjacent lower electrodes may be electrically connected to each other so that a bridge failure between the adjacent lower electrodes occurs frequently.

Accordingly, there is a need for a capacitor having a highly stacked structure that is stable enough to prevent falling down or slanting in a unit cell of reduced size, wherein the capacitor includes an electrode with a relatively large surface area.

SUMMARY

Example embodiments provide a capacitor that is stable enough to prevent falling down or slanting in a unit cell of reduced size, wherein the capacitor has an improved high capacitance.

Example embodiments also provide a method of forming the capacitor.

According to some example embodiments, a capacitor includes a substrate, a plurality of first storage electrodes, a plurality of second storage electrodes, a first supporting layer pattern, a dielectric layer and a plate electrode. A plurality of contact pads is formed I the substrate. The first storage electrodes are arranged along lines parallel with a first direction and electrically connected to the contact pads, respectively. The second storage electrodes are respectively stacked on the first storage electrodes. The first supporting layer pattern extends in a direction parallel with the first direction between adjacent second storage electrodes and makes contact with the adjacent second storage electrodes to support the second storage electrodes. The dielectric layer is formed on the first and second storage electrodes. The plate electrode is formed on the dielectric layer.

In an example embodiment, the capacitor may further include another supporting layer pattern extending in a second direction different from the first direction between adjacent second storage electrodes and making contact with the adjacent second storage electrodes to support the second storage electrodes. The first supporting layer pattern and the other supporting layer pattern may intersect with each other.

In another example embodiment, the capacitor may further include another supporting layer pattern extending between adjacent first storage electrodes and making contact with the adjacent first storage electrodes to support the first and second storage electrodes. The other supporting layer pattern may extend in the first direction. Alternatively, the other supporting layer pattern may extend in a second direction different from the first direction.

In an example embodiment, the first storage electrode may be a stack type storage electrode including a solid structure and the second storage electrode may be a cylinder type storage electrode including an opening therein.

The first storage electrode may include titanium nitride (TiN), titanium nitride (TiN) and polysilicon, titanium nitride (TiN) and silicon nitride (SiN) and polysilicon, titanium nitride (TiN) and tungsten (W), or titanium nitride (TiN) and tantalum oxide (TaO).

According to some example embodiments, in a method of forming a capacitor, a plurality of contact pads is formed in a substrate. A plurality of first storage electrodes is formed on the substrate, the first storage electrodes being electrically connected to the contact pads and arranged along lines parallel with the first direction. A first mold layer and a first supporting layer are formed on the substrate including the first storage electrodes. The first supporting layer and the first mold layer are sequentially etched to form first openings that expose the first storage electrodes. A first conductive material is formed on inner surfaces of the first openings to form second storage electrodes on the first storage electrodes. The first supporting layer is patterned to form a first supporting layer pattern, the first supporting layer pattern extending in a direction parallel with the first direction between adjacent second storage electrodes and making contact with the adjacent second storage electrodes to support the second storage electrodes. A dielectric layer is formed on the first and second storage electrodes. A plate electrode is formed on the dielectric layer.

In an example embodiment, the method may further include patterning the first supporting layer having the first openings formed therein to form another supporting layer pattern, the other supporting layer pattern extending in a direction different from the first direction between adjacent second storage electrodes and making contact with the adjacent second storage electrodes to support the second storage electrodes. The first supporting layer pattern and the other supporting layer pattern may intersect with each other.

In another example embodiment, forming the first storage electrodes may include forming a second mold layer and a second supporting layer on the substrate in which the contact pads are formed, sequentially etching the second supporting layer and the second mold layer to form second openings that expose the contact pads, the second openings being arranged along lines parallel with the first direction, forming a second conductive material on inner surfaces of the second openings to form the first storage electrodes, and patterning the second supporting layer having the second openings formed therein to form another supporting layer pattern, the other supporting layer pattern extending between adjacent first storage electrodes and making contact with the adjacent first storage electrodes to support the first and second storage electrodes.

The other supporting layer pattern extending between adjacent first storage electrodes may extend in the first direction. Alternatively, the other supporting layer pattern extending between adjacent first storage electrodes may extend in a second direction different from the first direction.

In another example embodiment, forming the first storage electrodes may include filling the second openings with the second conductive material.

In this case, the second conductive material may include titanium nitride (TiN), titanium nitride (TiN) and polysilicon, titanium nitride (TiN) and silicon nitride (SiN) and polysilicon, titanium nitride (TiN) and tungsten (W), or titanium nitride (TiN) and tantalum oxide (TaO).

In another example embodiment, the method may further include, prior to forming the dielectric layer, removing the first and second mold layers.

In another example embodiment, forming the first supporting layer pattern may include forming a sacrificial layer pattern filling the first openings, forming a photoresist pattern on the first supporting layer to define regions for the first support layer pattern to be formed, and etching the first supporting layer using the photoresist pattern as an etching mask to form the first supporting layer pattern on the first mold layer.

In an example embodiment, the first supporting layer may include silicon nitride (SiN), silicon carbonitride (SiCN), tantalum oxide (TaO), titanium oxide (TiO2), etc. These may be used alone or in a combination thereof.

According to some example embodiments, a capacitor includes a substrate, a plurality of first storage electrodes arranged on the substrate, a plurality of second storage electrodes respectively stacked on the first storage electrodes, a first supporting layer pattern extending between adjacent second storage electrodes and contacting the adjacent second storage electrodes, a dielectric layer on the first and second storage electrodes, and a plate electrode on the dielectric layer.

As mentioned above, a capacitor according to example embodiments includes a storage electrode having different type first and second storage electrodes stacked on each other. A supporting layer pattern may extend between the second storage electrodes or between the first and second storage electrodes to make contact with outer surfaces of the second storage electrodes or the first and second storage electrodes. Accordingly, the supporting layer pattern may prevent the highly stacked second storage electrodes from leaning or slanting.

BRIEF DESCRIPTION OF THE DRAWINGS

Example embodiments will be more clearly understood from the following detailed description taken in conjunction with the accompanying drawings.

FIG. 1 is a cross-sectional view illustrating a capacitor in accordance with an example embodiment.

FIG. 2 is a perspective view illustrating a storage electrode of the capacitor in FIG. 1.

FIG. 3 is a plan view illustrating the storage electrode in FIG. 2.

FIGS. 4 to 17 are views illustrating a method of forming the capacitor in FIG. 1.

FIG. 18 is a perspective view illustrating a storage electrode of a capacitor in accordance with an example embodiment.

DETAILED DESCRIPTION OF THE EMBODIMENTS

Figure 1:
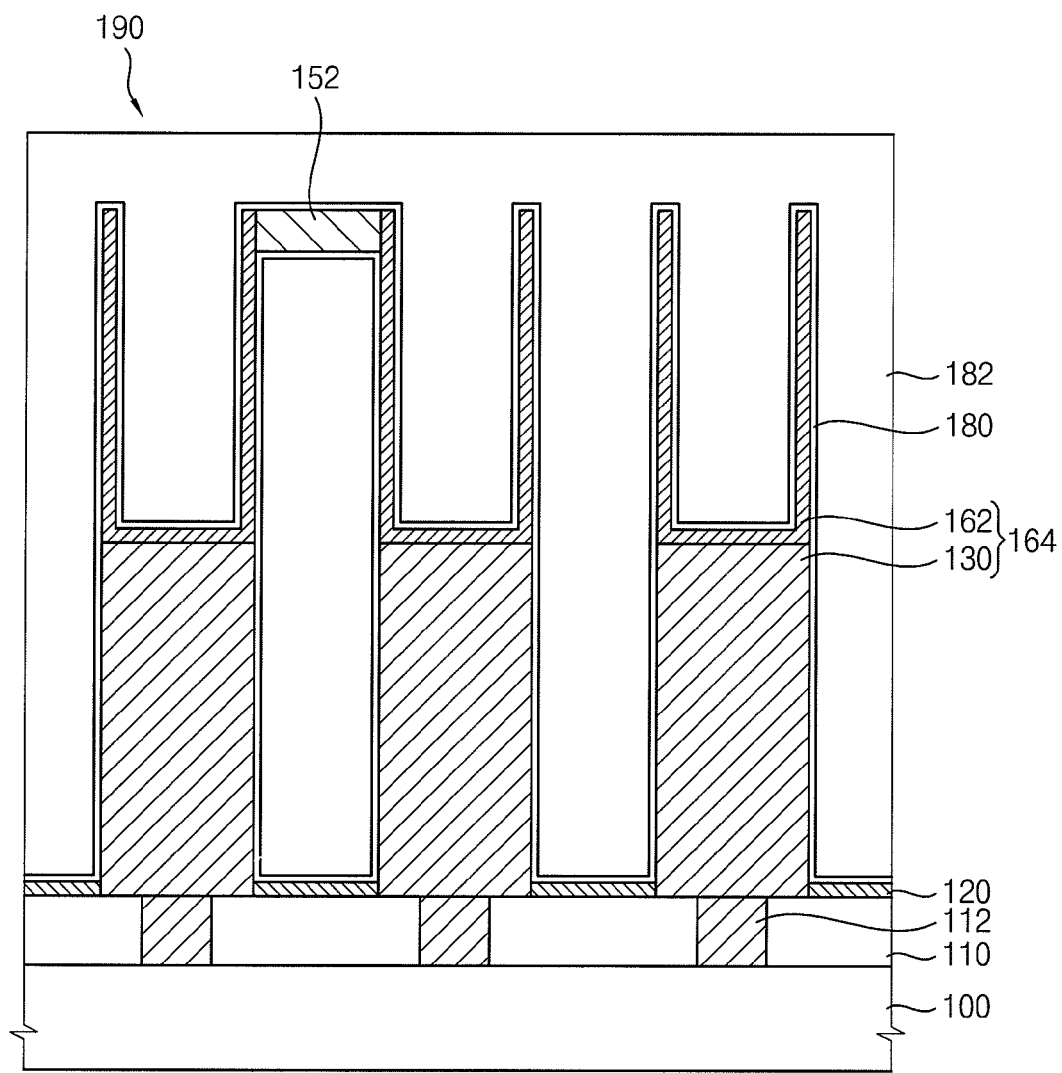
FIGS. 1 to 18 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals may refer to like elements throughout.

Hereinafter, example embodiments will be explained in detail with reference to the accompanying drawings.

Figure 2:
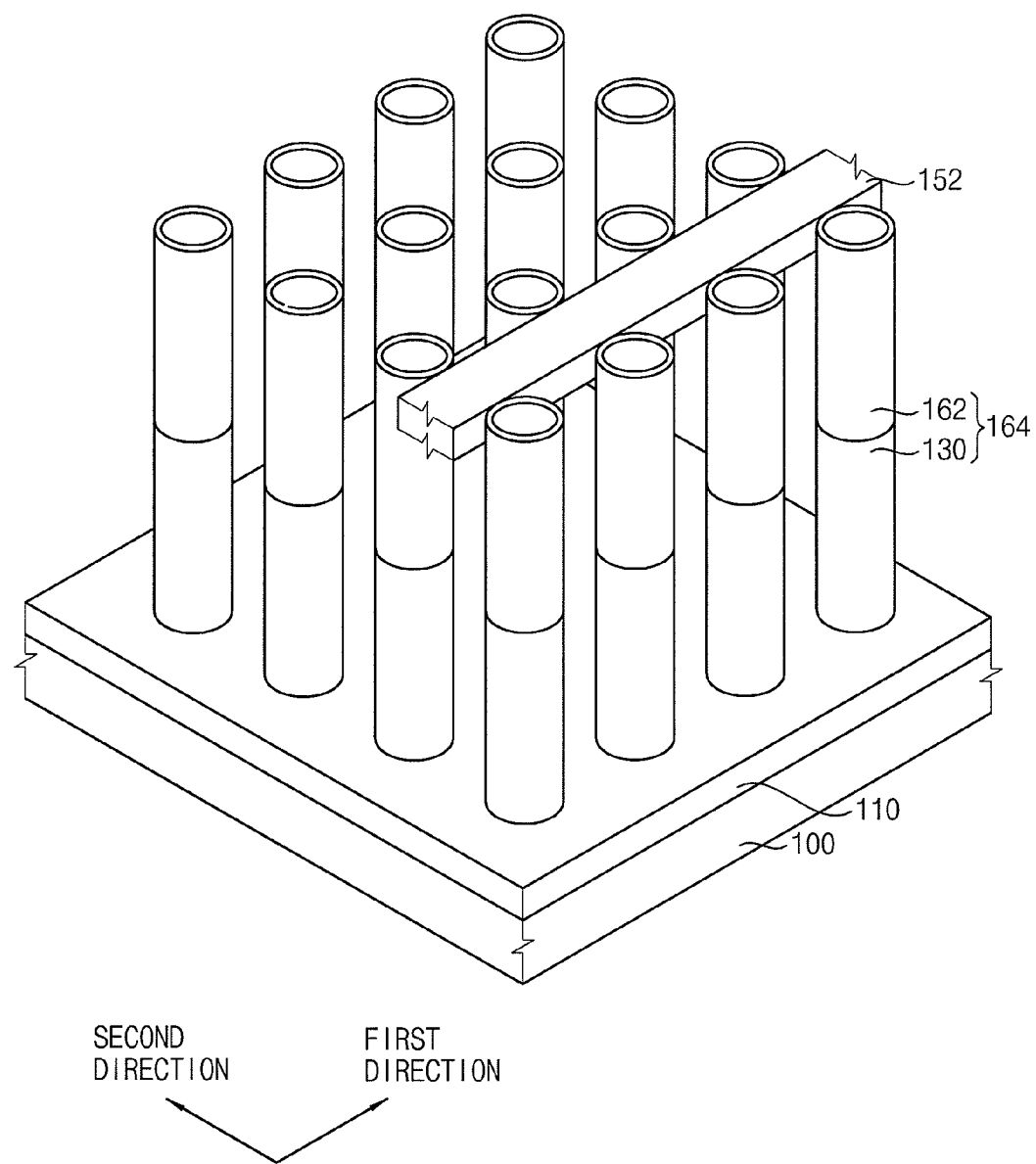
Figure 3:
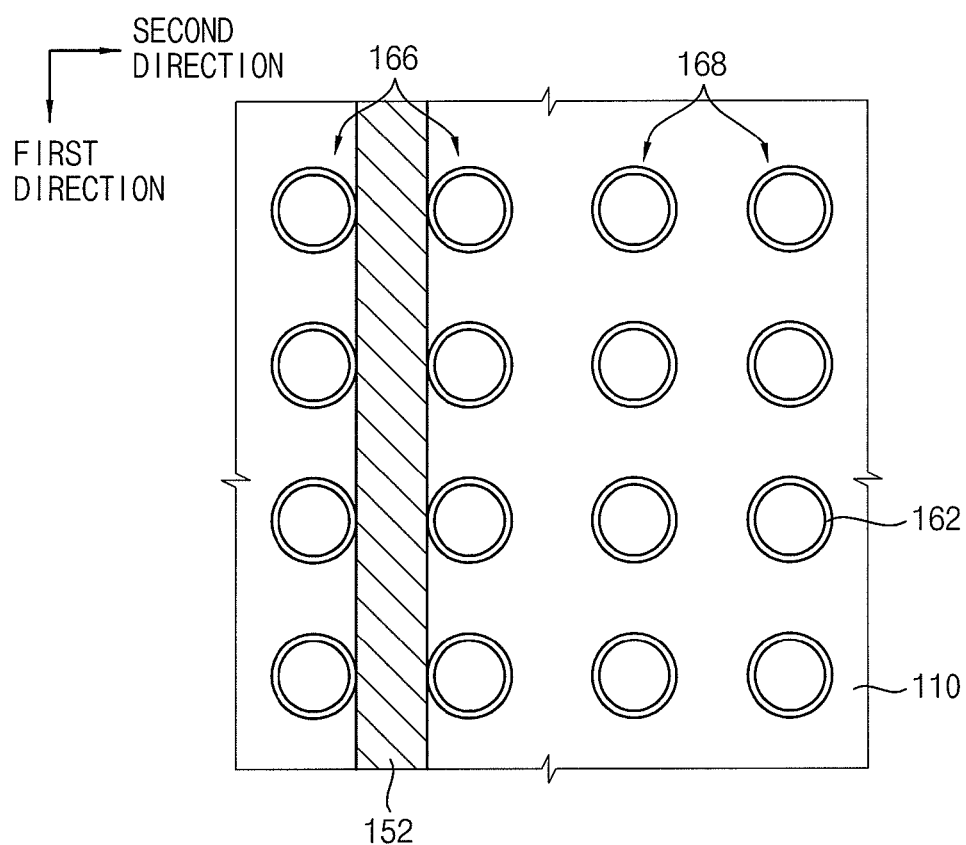

FIG. 1 is a cross-sectional view illustrating a capacitor in accordance with an example embodiment. FIG. 2 is a perspective view illustrating a storage electrode of the capacitor in FIG. 1. FIG. 3 is a plan view illustrating the storage electrode in FIG. 2.

Referring to FIGS. 1 to 3, a capacitor 190 according to an example embodiment includes storage electrodes 164 having a plurality of first and second storage electrodes 130 and 162 formed on a substrate 100, a supporting layer pattern 152 supporting the storage electrodes 164, a dielectric layer 180 formed on the storage electrode 164 and a plate electrode 182 formed on the dielectric layer 180.

In example embodiments, an isolation layer (not illustrated) may be provided in the substrate 100 to define an active region and a field region. A lower structure (not illustrated) may be provided in the substrate 100. Examples of the substrate 100 may be a silicon substrate, a silicon-on-insulator (SOI) substrate, etc. Examples of the lower structure may be a transistor, a bit line, etc.

An insulating interlayer 110 may be provided on the substrate 100. The insulating interlayer 110 may have a plurality of contact pads 112. For example, the contact pad 112 may be connected to a drain region of the transistor.

A plurality of the first storage electrodes 130 may be provided on the insulating interlayer 110. The first storage electrodes 130 may be formed on the contact pads 112, respectively. The first storage electrode 130 may be connected to the contact pad 112.

A plurality of the second storage electrodes 162 may be stacked on the first storage electrodes 130. Accordingly, the second storage electrodes 162 may be positioned similarly to the first storage electrodes 130. A second storage electrode 162 is connected to a first storage electrode 130 to form one storage electrode 164.

In example embodiments, the first and second storage electrodes 130 and 162 may be arranged repeatedly along lines parallel with a first direction, and along lines parallel with a second direction different from the first direction. For example, the first direction may be perpendicular to the second direction.

In an example embodiment, the second storage electrodes 162 may include a first group 166 of the second storage electrodes and a second group 168 of the second storage electrodes. The first group 166 of the second storage electrodes may be arranged adjacent to the second group 168 of the second storage electrodes.

The first group of the second storage electrodes may be arranged along first and second lines. The first and second lines may be parallel with each other and may be spaced apart from each other by a predetermined distance. The second group of the second storage electrodes may be arranged along third and fourth lines. The third and fourth lines may be parallel with each other and may be spaced apart from each other by a predetermined distance.

In an example embodiment, the first storage electrode 130 may be a stack type storage electrode having a solid structure. The second storage electrode 162 may be a cylinder type storage electrode having an opening. Alternatively, both the first and second storage electrodes 130 and 162 may be cylinder type storage electrodes having openings.

The supporting layer pattern 152 extends between adjacent second storage electrodes 162. The supporting layer pattern 152 contacts side faces of the adjacent second storage electrodes 162 to support the second storage electrodes 162.

In an example embodiment, the supporting layer pattern 152 extends between the first group 166 of adjacent second storage electrodes in the first direction. The supporting layer pattern 152 contacts outer surfaces of the first group 166 of the second storage electrodes. Accordingly, the second storage electrodes 162 having highly stacked structures may be prevented from inclining or slanting.

The supporting layer pattern 152 may be positioned to contact an upper portion of the storage electrodes 162. Alternatively, the supporting layer pattern 152 may be positioned to contact the middle or a lower portion of the storage electrodes 162.

The dielectric layer 180 is provided on the storage electrodes 164 having the first and second storage electrodes 130 and 162 and the plate electrode 182 is provided on the dielectric layer 180 to form the capacitor 190.

Hereinafter, a method of forming a capacitor in accordance with an example embodiment will be explained.

FIGS. 4 to 17 are views illustrating a method of forming the capacitor in FIG. 1.

Figure 4:
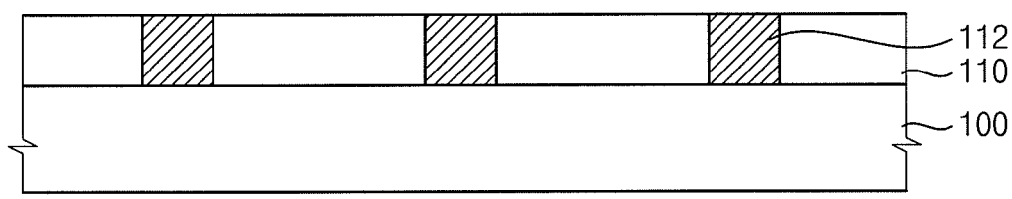

Referring to FIG. 4, a plurality of contact pads 112 are formed on a substrate 100.

In example embodiments, before the contact pads 112 are formed, an isolation layer (not illustrated) may be formed in the substrate 100 to define an active region and a field region. Then, a lower structure (not illustrated) may be formed in the substrate 100. Examples of the lower structure may be a transistor, a bit line, etc.

An insulating interlayer 110 is formed on the substrate having the lower structure, such as transistors, formed therein. The insulating interlayer 110 may be formed using silicon oxide. The insulating interlayer 110 is partially etched to form first contact holes (not illustrated) that expose source/drain regions of the transistors. Then, the first contact holes are filled with conductive material to form a plurality of contact pads 112. For example, a contact pad 112 may be connected to the drain region of the transistor.

Figure 5:
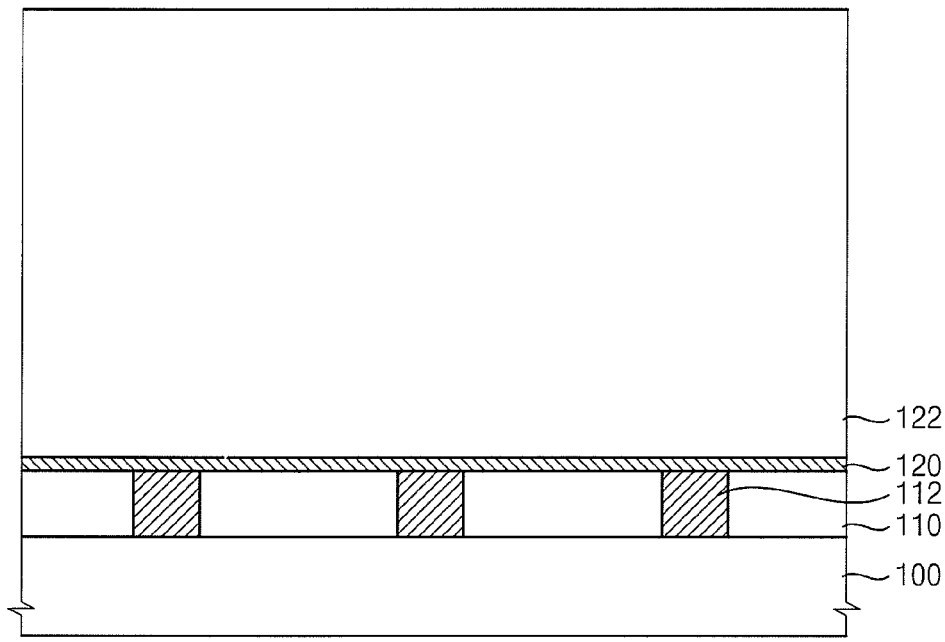

Referring to FIG. 5, an etch stop layer 120 is formed on the insulating interlayer 110. The etch stop layer may be formed using an insulating material including nitride. For example, the etch stop layer may be formed using silicon nitride.

Then, a first mold layer 122 is formed on the etch stop layer 120. In example embodiments, the first mold layer 122 is used to form a first storage electrode.

The first mold layer 122 may be formed using an insulating material including oxide. For example, the first mold layer 122 may include Tetraethyl orthosilicate (TEOS), high density plasma-chemical vapor deposition (HDP-CVD) oxide, phosphor silicate glass (PSG), undoped silicate glass (USG), boron phosphorus silicate glass (BPSG), system on chip (SOC), etc.

A height of the first storage electrode depends on a thickness of the first mold layer 122. Accordingly, it should be understood that the thickness of the first mold layer 122 may be determined to meet a required capacitance of a resultant capacitor.

Figure 6:
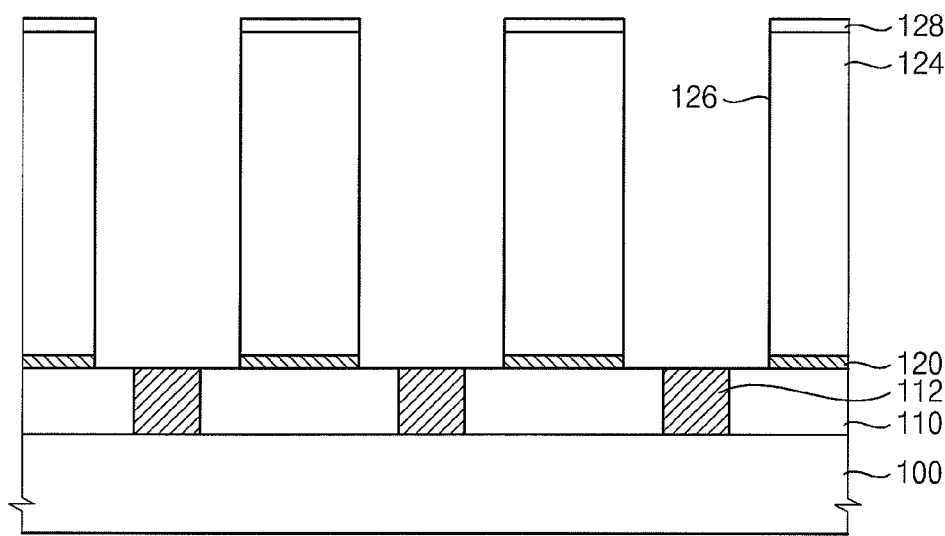

Referring to FIG. 6, the first mold layer 122 is patterned to form a first mold layer pattern 124 having first openings 126 that define regions for the first storage electrodes to be formed. The first openings 126 expose upper surfaces of the contact pads 112.

In an example embodiment, a first mask layer (not illustrated) is formed on the first mold layer 122. The first mask layer may be formed using a material having an etch selectivity with respect to the first mold layer 122. A photoresist pattern (not illustrated) may be formed on the first mask layer to define regions for the first storage electrodes to be formed. For example, the first mask layer may be formed using polysilicon, nitride, etc.

The first mask layer is etched using the first photoresist pattern as an etching mask to form a first mask 128 that defines the regions where the first storage electrodes are to be formed. Then, the first photoresist pattern may be removed by ashing and strip processes.

Then, the first mold layer 122 and the etch stop layer 120 are partially etched using the first mask 128 to form first openings 126 that expose the contact pads 112.

Figure 7:
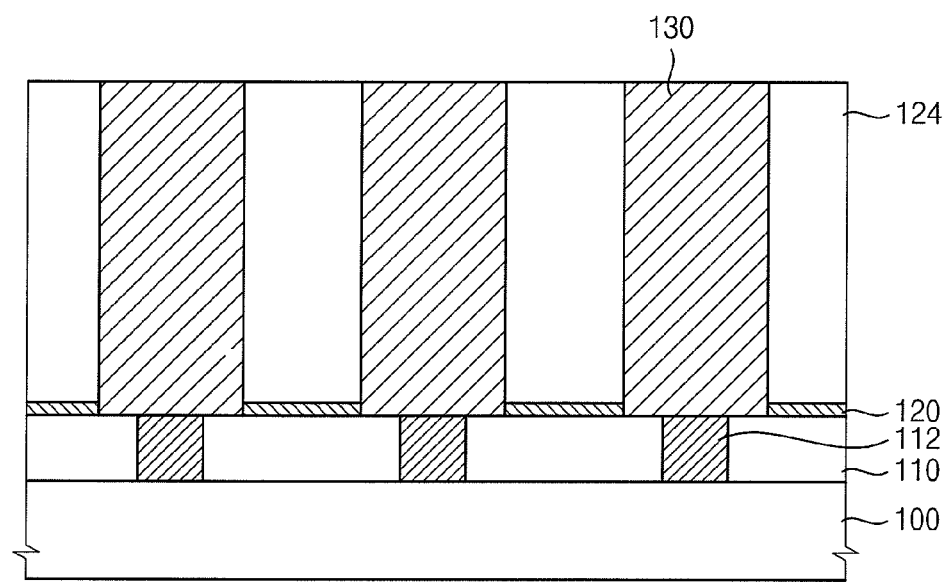

Referring to FIG. 7, the first openings 126 are filled with a conductive material to form a plurality of first storage electrodes 130. Examples of the conductive material include titanium nitride (TiN), titanium nitride (TiN)/polysilicon, titanium nitride (TiN)/silicon nitride (SiN)/polysilicon, titanium nitride (TiN)/tungsten (W), titanium nitride (TiN)/tantalum oxide (TaO), etc.

In an example embodiment, the first opening 126 is filled using titanium nitride (TiN) to form the first storage electrode 130. Alternatively, a first conductive material including titanium nitride (TiN) is formed conformally on an inner surface of the first opening 126 and then a second conductive material including silicon nitride (SiN), tungsten (W) or tantalum oxide (TaO) is formed on the first conductive material to form the first storage electrode 130.

Alternatively, the first conductive material including titanium nitride (TiN) is formed conformally on the inner surface of the first opening 126 and then the second conductive material including silicon nitride (SiN) is formed on the first conductive material. Then, a third conductive material including polysilicon is formed on the second conductive material to form the first storage electrode 130.

Then, the conductive material and the first mask 128 are removed from the first mold layer pattern 124. The conductive material and the first mask 128 may be removed by a chemical mechanical polishing process, an etch-back process, etc.

Accordingly, the first openings 126 of the first mold layer pattern 124 are completely filled with the conductive material to form the stack type first storage electrodes 130.

Figure 8:
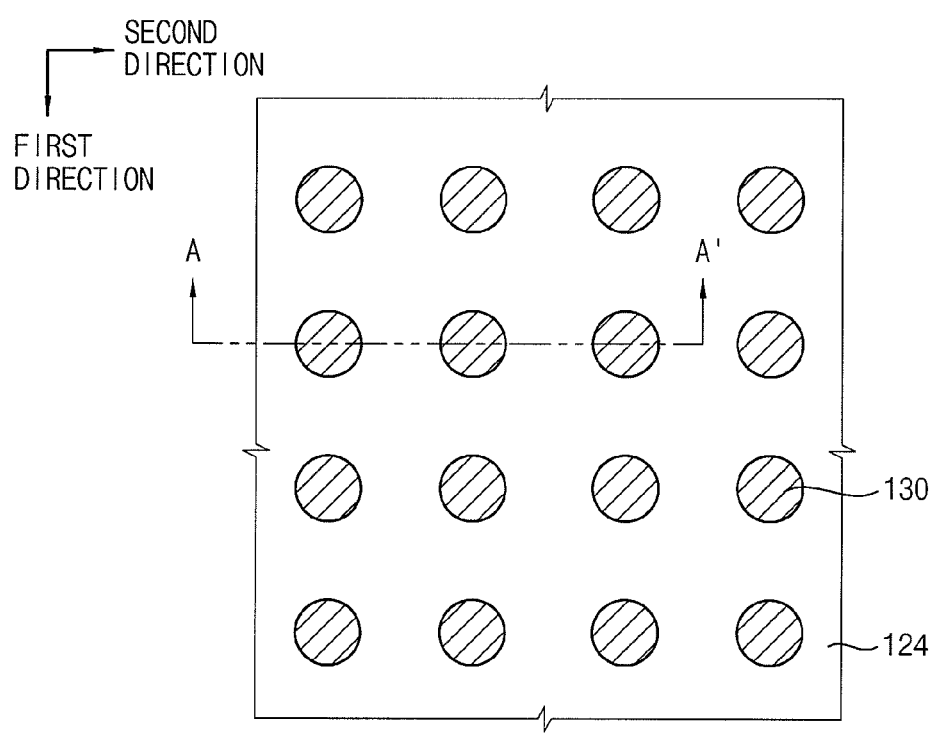

FIG. 8 is a plan view illustrating an arrangement of the first storage electrodes in FIG. 7. FIG. 7 is a cross-sectional view taken along the line A-A' of FIG. 8.

Referring to FIG. 8, in an example embodiment, the first storage electrodes 130 may be arranged repeatedly along lines parallel with a first direction, and repeatedly along lines parallel with a second direction different from the first direction. For example, the first direction may be substantially perpendicular to the second direction.

Figure 9:
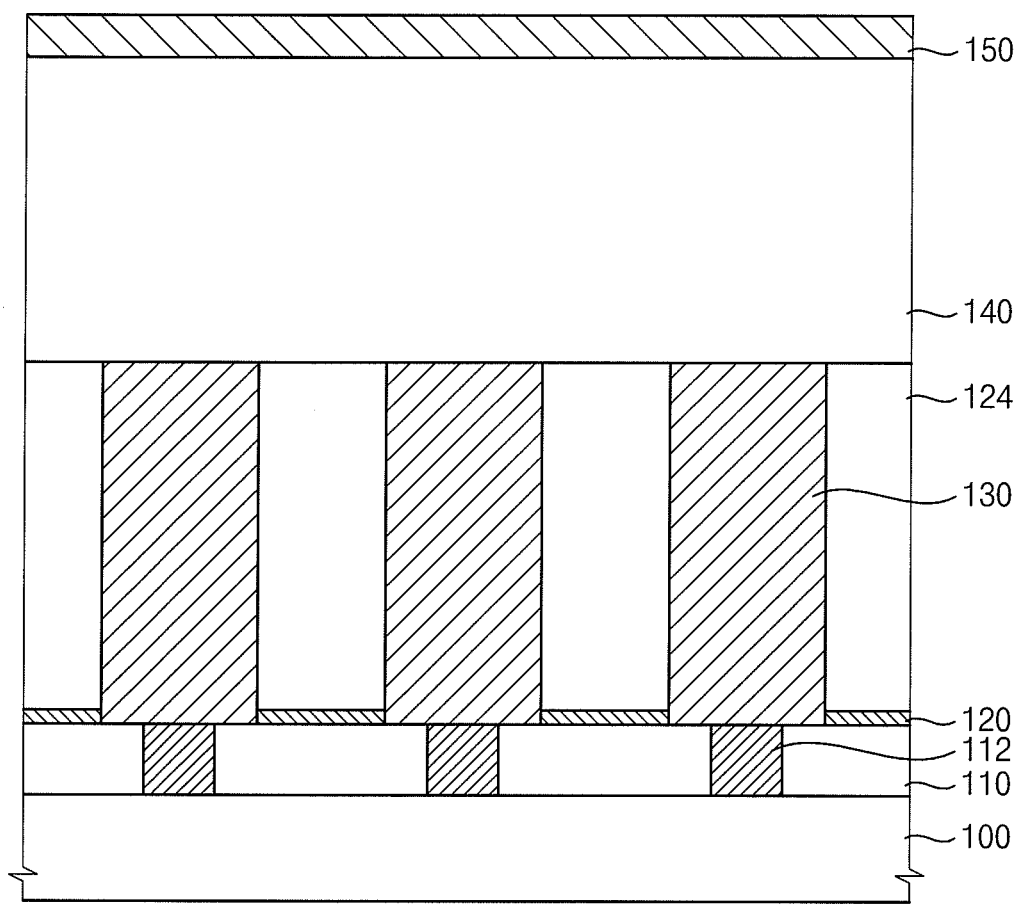

Referring to FIG. 9, a second mold layer 140 and a supporting layer 150 are sequentially formed on the first mold layer pattern 124 in which the first storage electrodes 130 are formed. In example embodiments, the second mold layer 140 is used to form second storage electrodes.

The second mold layer 140 may include an insulating layer including, for example, an oxide. For example, the second mold layer 140 may include TEOS, HDP-CVD oxide, PSG, USG, BPSG, SOC, etc.

A height of the second storage electrode depends on a thickness of the second mold layer 140. Accordingly, it should be understood that the thickness of the second mold layer 140 may be determined to meet a required capacitance of a resultant capacitor.

The supporting layer 150 may have an etch selectivity with respect to the first mold layer 122 and the second mold layer 140. The supporting layer 150 may be formed using an insulating material such as nitride. For example, the supporting layer 150 may include silicon nitride (SiN), silicon carbonitride (SiCN), tantalum oxide, titanium oxide (TiO$_2$), etc. These materials may be used alone or in a combination thereof.

Figure 10:
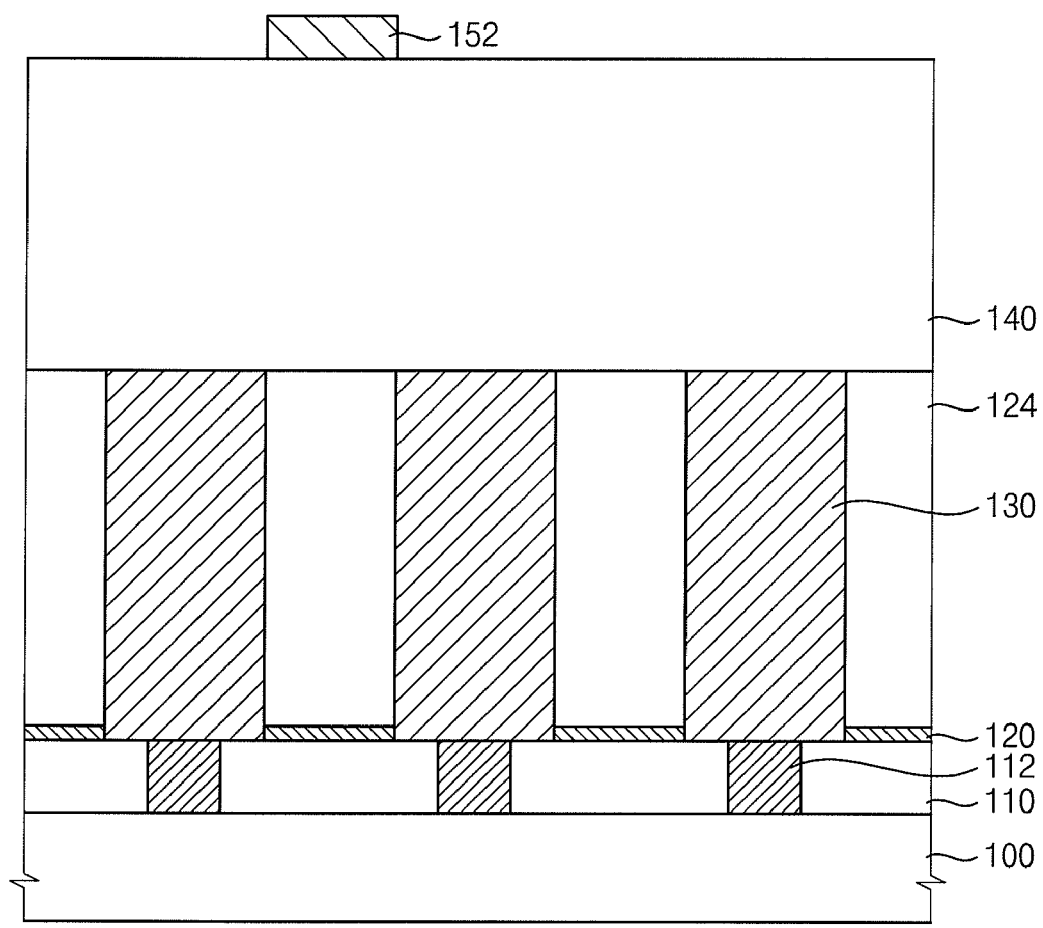

Referring to FIG. 10, the supporting layer 150 is patterned to form a supporting layer pattern 152 on the second mold layer 140.

In an example embodiment, a second photoresist pattern (not illustrated) may be formed on the supporting layer 150, and the supporting layer 150 may be patterned using the second photoresist pattern to form the supporting layer pattern 152. Then, the second photoresist pattern may be removed from the second mold layer 140.

Figure 11:
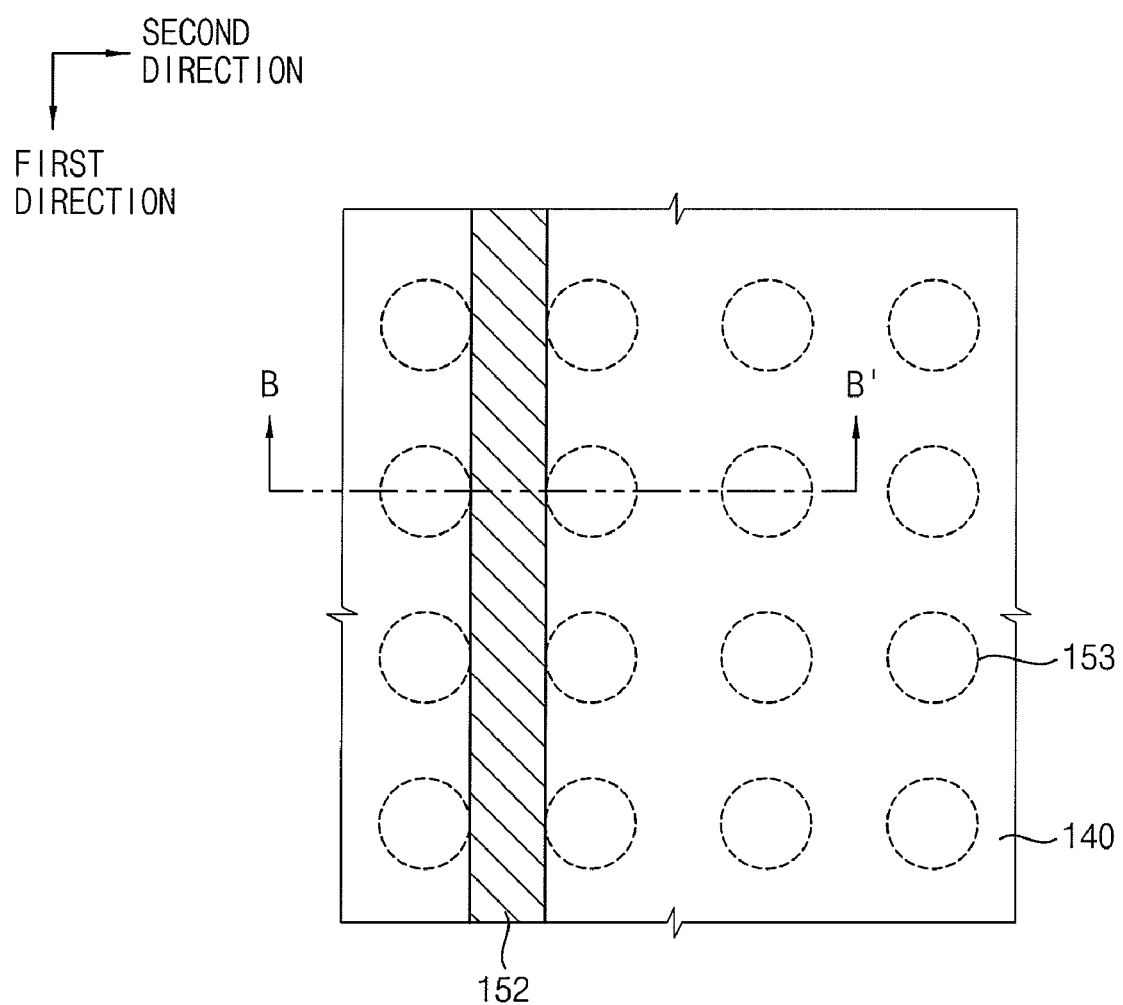

FIG. 11 is a plan view illustrating the supporting layer pattern in FIG. 10. FIG. 10 is a cross-sectional view taken along the line B-B' in FIG. 11.

Referring to FIG. 11, in an example embodiment, the supporting layer pattern 152 has a linear shape extending in a direction parallel with the first direction. The supporting layer pattern 152 extends between the regions 153 where the adjacent second storage electrodes are to be formed.

The supporting layer pattern 152 may extend in the direction parallel with the first direction between the regions 153 where the adjacent second storage electrodes are to be formed. The supporting layer pattern 152 may face portions of each of the regions 153.

Figure 12:
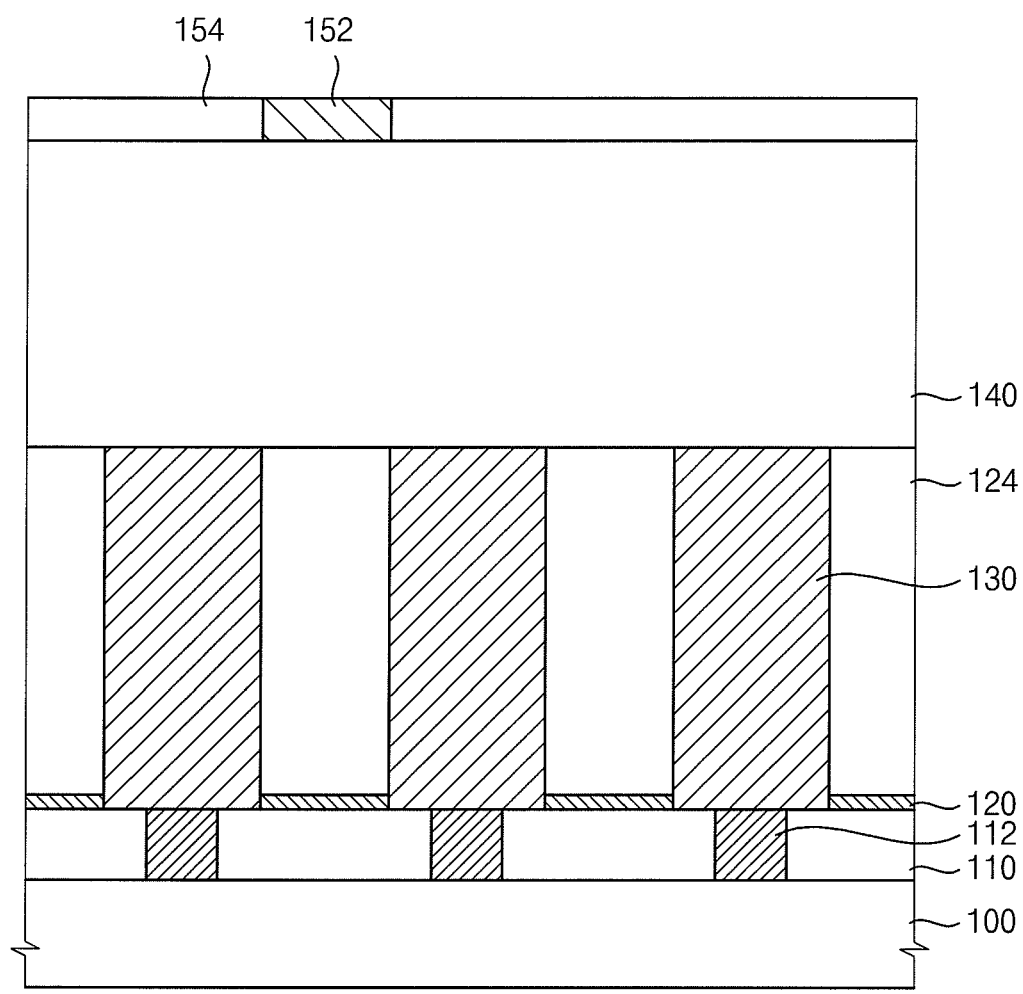

Referring to FIG. 12, a third mold layer 154 is formed on the second mold layer 140. The third mold layer 154 may have a planarized upper surface that was planarized by a planarization process. In an example embodiment, an upper portion of the third mold layer 154 may be partially removed to have an upper surface coplanar with the upper surface of the supporting layer pattern 152.

The third mold layer 154 may include, for example, an insulating material including an oxide. For example, the third mold layer 154 may include TEOS, HDP-CVD oxide, PSG, USG, BPSG, SOG, etc.

Figure 13:
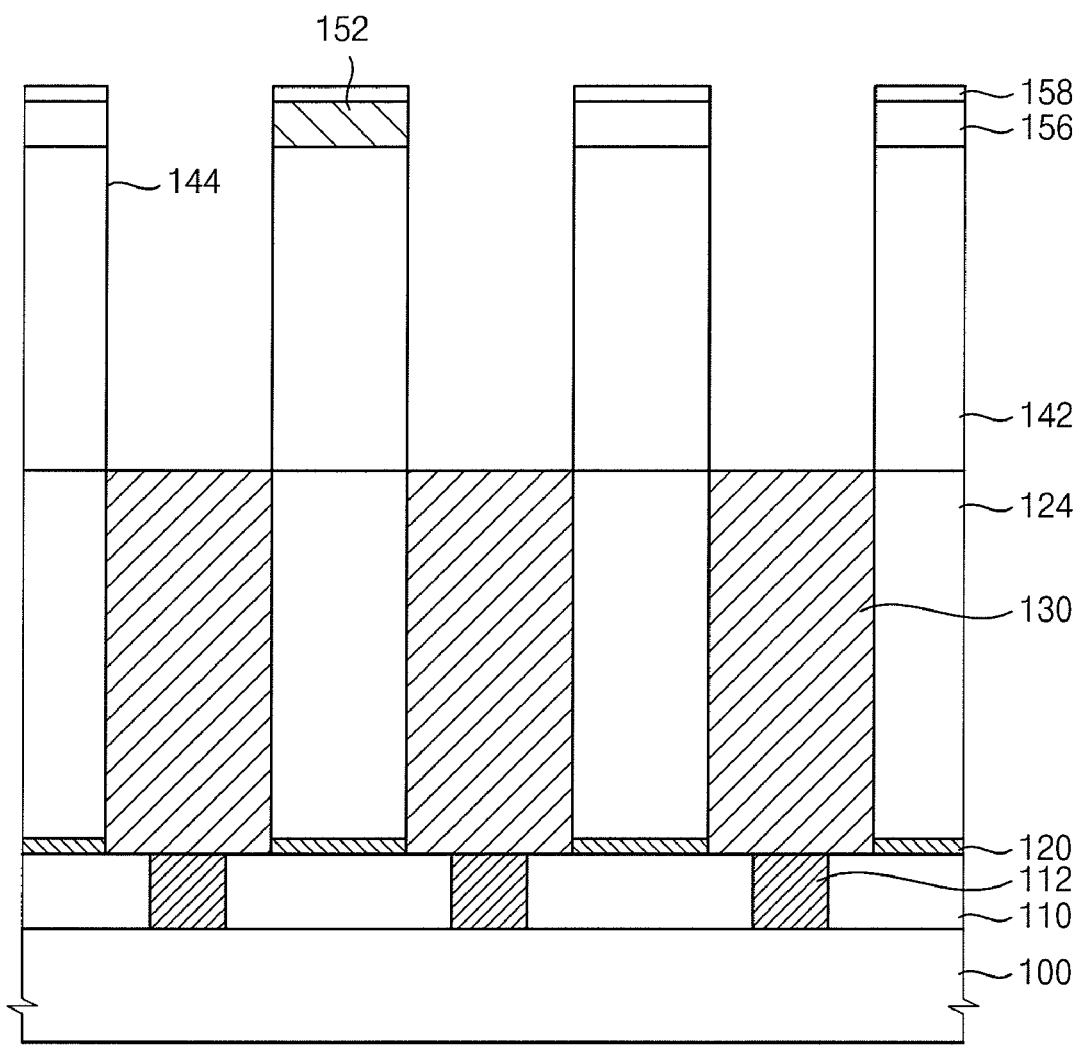

Referring to FIG. 13, the third mold layer 154 and the second mold layer 140 are patterned to form second and third mold layer patterns 142 and 156 having second openings 144.

The second openings 144 define regions where the second storage electrodes are to be formed. The second openings 144 expose upper surfaces of the first storage electrodes 130.

In an example embodiment, a second mask layer (not illustrated) may be formed on the third mold layer 154 using a material having an etch selectivity with respect to the second and third mold layers 142 and 154. A third photoresist pattern (not illustrated) is formed on the second mask layer to define the regions for the second storage electrodes. For example, the second mask layer may be formed using polysilicon, nitride, etc.

The second mask layer is etched using the third photoresist pattern as an etching mask to form a second mask 158 on the third mold layer 154. The second mask 158 may define the regions for the second storage electrodes. Then, the second photoresist pattern may be removed by ashing and strip processes.

Then, the third mold layer 154 and the second mold layer 140 may be partially etched using the second mask 158 to form the second and third mold layer patterns 142 and the 156 having the second openings 144 that expose the first storage electrodes 130.

Figure 14:
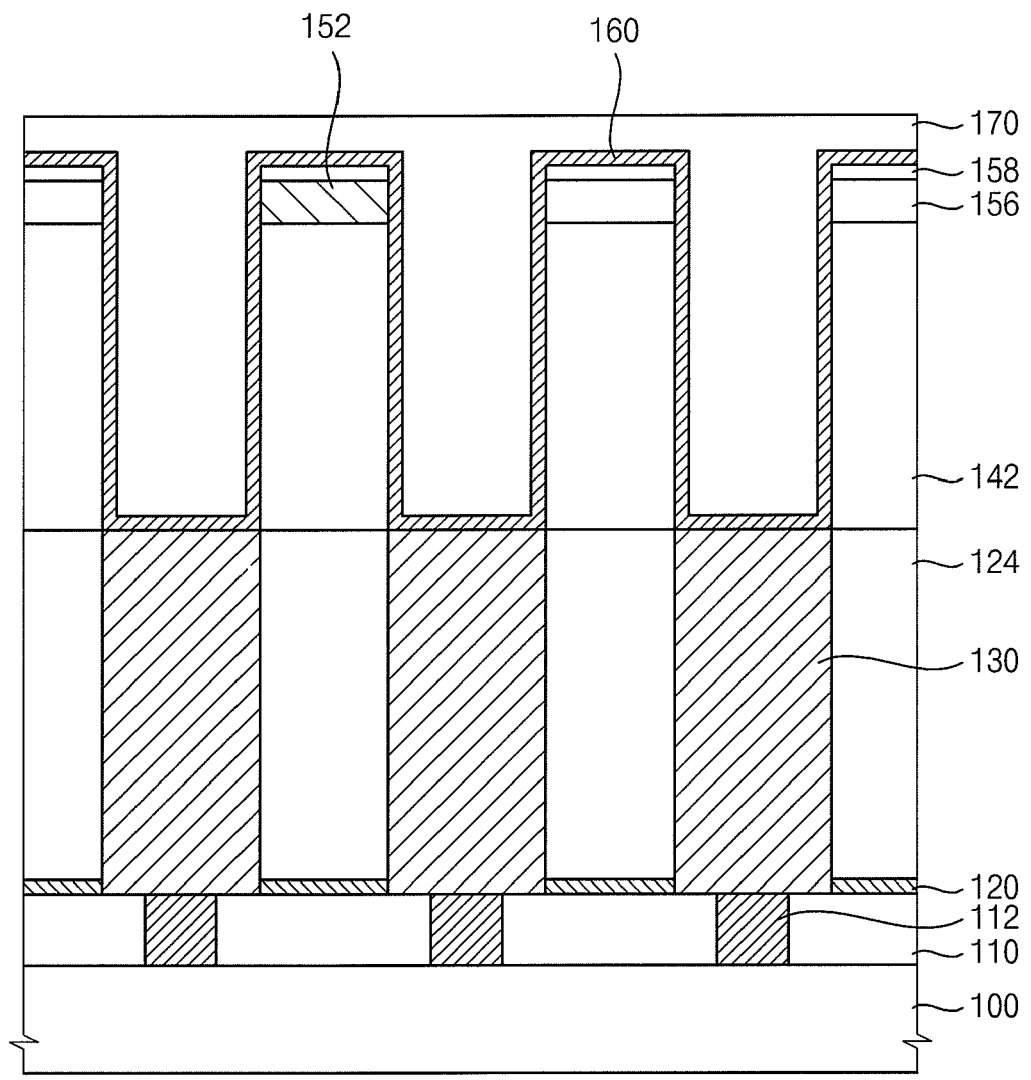

Referring to FIG. 14, a conductive layer 160 is formed on an upper surface of the exposed first storage electrode 130, an inner surface of the second opening 144 and the second mask 158. For example, the conductive layer 160 may include polysilicon, metal, etc.

Then, a sacrificial layer 170 is formed on the conductive layer 160 to completely fill the second openings 144. For example, the sacrificial layer 170 may include silicon oxide. The sacrificial layer 170 may include BPSG, USG, etc.

Figure 15:
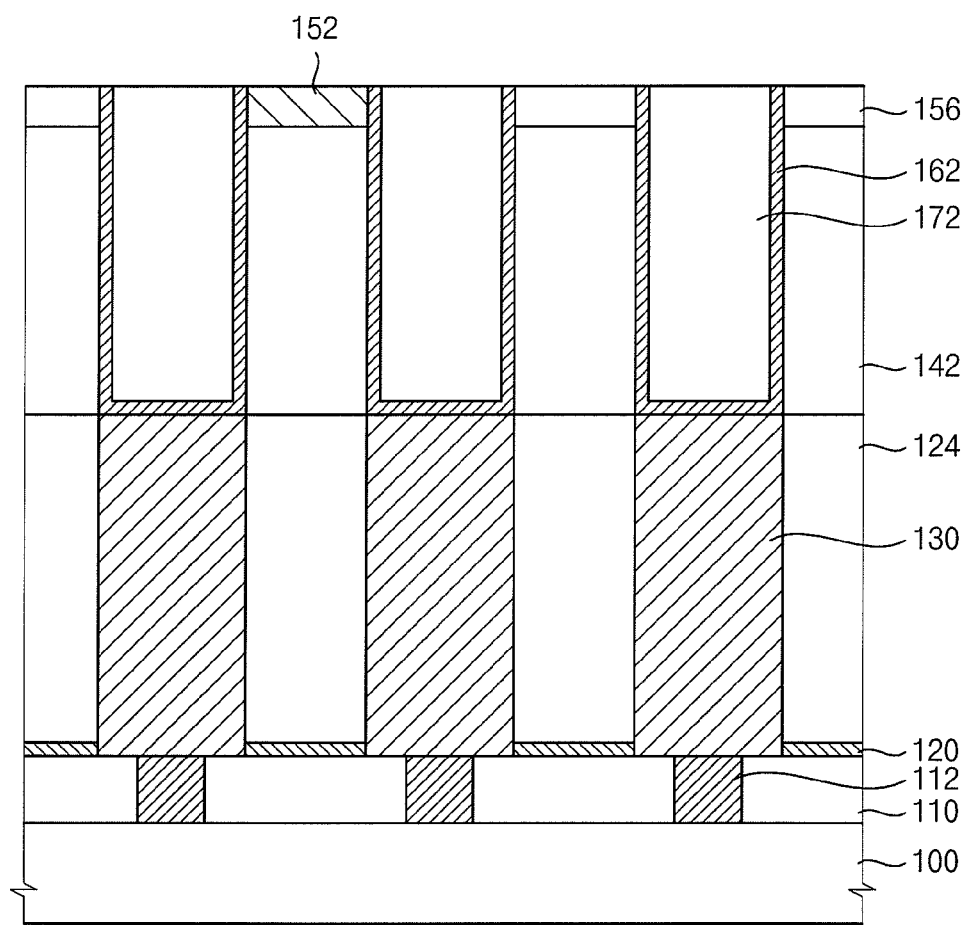

Referring to FIG. 15, an upper portion of the sacrificial layer 170, a portion of the conductive layer 160 on the third mold layer pattern 156 and the second mask 158 are removed to expose the third mold layer pattern 156 and the supporting layer pattern 152. For example, the upper portion of the sacrificial layer 170, the portion of the conductive layer 160 and the second mask 158 may be removed by a chemical mechanical polishing process, an etch-back process, etc.

Accordingly, the conductive layer 160 is formed only on the inner surface of the second opening 144 to form a cylinder type second storage electrode 162.

In this embodiment, after the supporting layer pattern 152 is formed on the second mold layer 140, the second mold layer 140 is patterned to form the second mold layer pattern 142 having the second openings 144 that define the regions where the second storage electrodes are to be formed, and then, the second storage electrodes 162 are formed in the second openings 144.

Alternatively, after the second mold layer 140 is first patterned to form the second mold layer pattern 142 having the second openings that define the regions where the second storage electrodes are to be formed, a sacrificial layer pattern may be formed to fill the second openings. Then, after a photoresist pattern is formed on the supporting layer 150 to define a region where the supporting layer pattern is to be formed, the supporting layer 150 is patterned using the photoresist pattern to form the supporting layer pattern 152 on the second mold layer pattern 142. After the sacrificial layer pattern is removed from the second opening, the second storage electrode 162 may be formed on the inner surface of the second opening.

Figure 16:
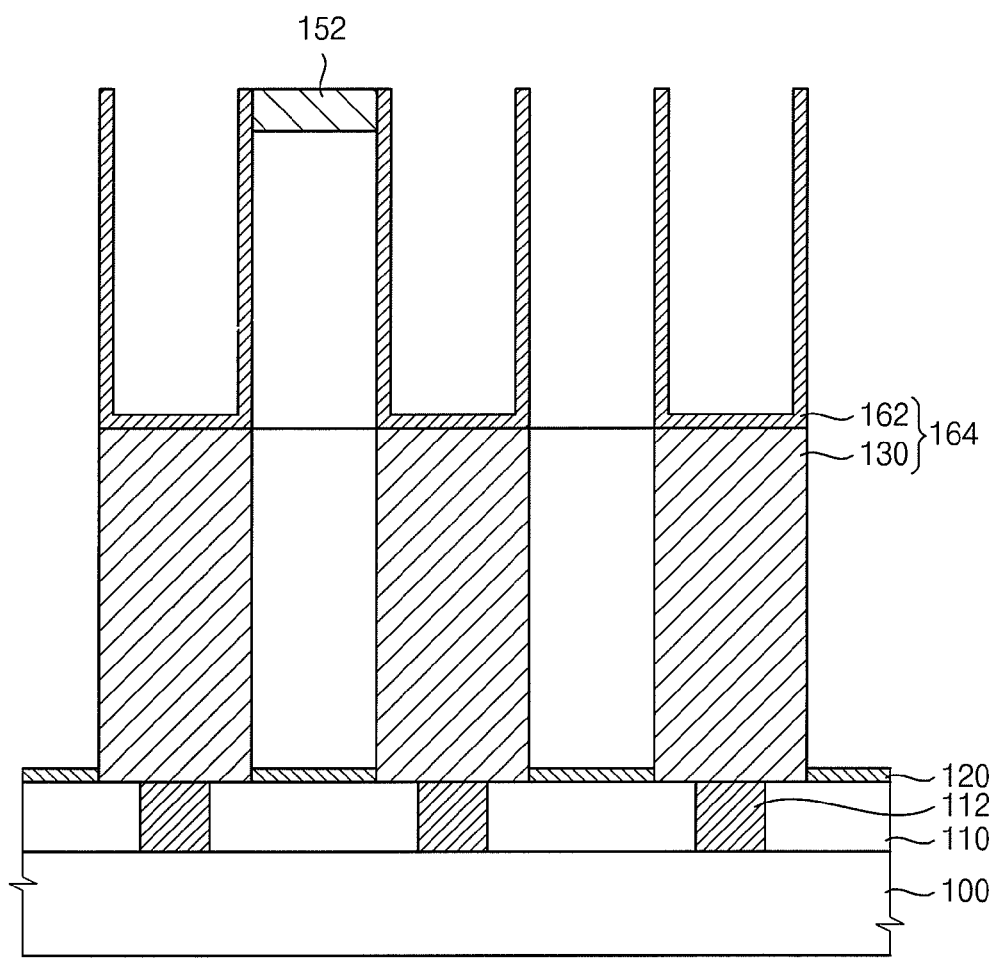

Referring to FIG. 16, after the second storage electrode 162 is formed, the sacrificial layer pattern 172 in the second opening 144, the third mold layer pattern 156, the second mold layer pattern 142 and the first mold layer pattern 124 are removed from the substrate 100 to form a storage electrode 162 having the stacked first and second storage electrodes 130 and 162.

In an example embodiment, the storage electrode 164 may include the stack type first storage electrode 130 and the cylinder type second storage electrode 162 formed on the first storage electrode 130. Accordingly, the storage electrode 164 includes different type storage electrodes that are highly stacked on each other. Thus, the storage electrode, including the supporting layer pattern 152 may provide improved high capacitance due to an expanded surface area without tilting or slanting.

Figure 17:
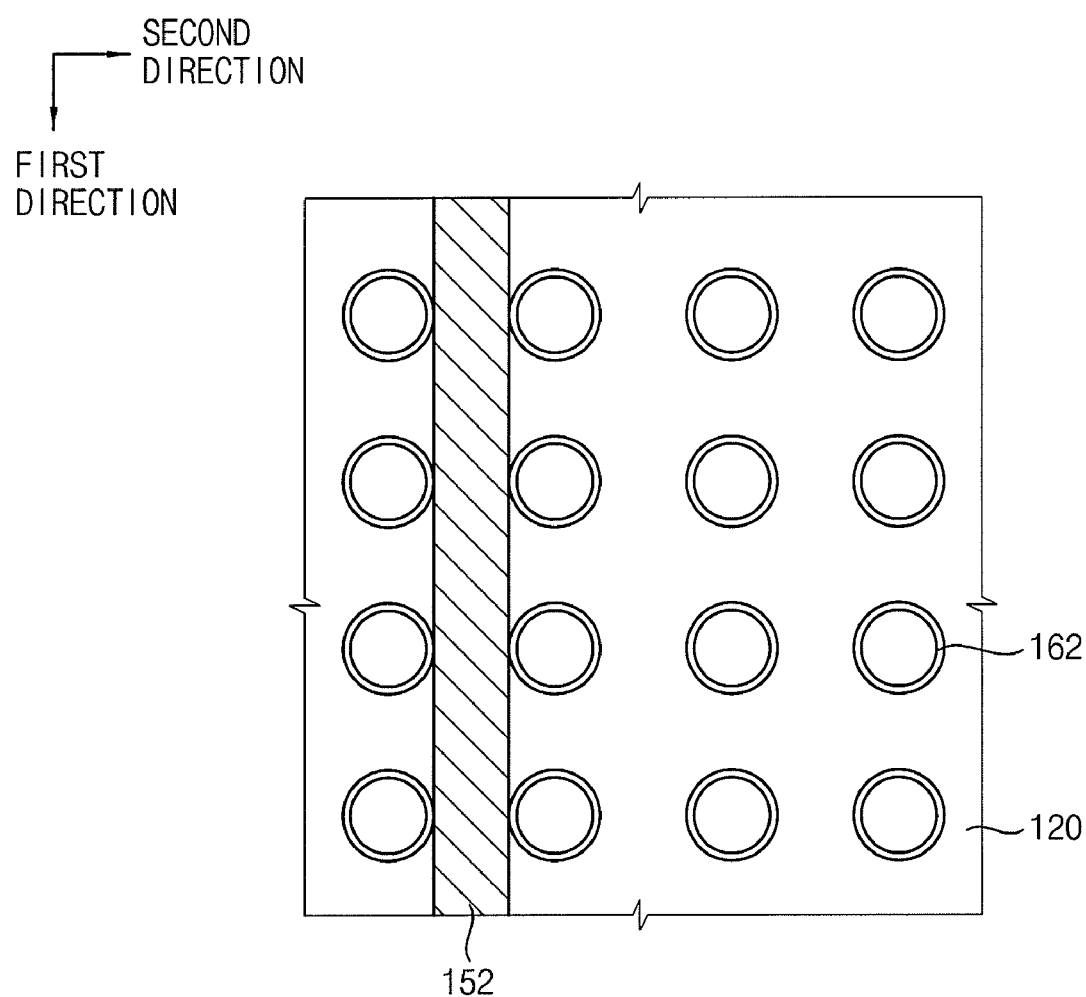

FIG. 17 is a plan view illustrating an arrangement of the second storage electrodes and the supporting layer pattern in FIG. 16. FIG. 16 is a cross-sectional view taken along the line C-C' in FIG. 17.

Referring to FIG. 17, in an example embodiment, the second storage electrodes 162 may be arranged repeatedly along lines parallel with the first direction, and repeatedly along lines parallel with the second direction different with the first direction.

The supporting layer pattern 152 may extend in a direction parallel with the first direction between adjacent second storage electrodes 162. The supporting layer pattern 154 contacts side faces of the adjacent second storage electrodes 162 to support the second storage electrodes 162.

Accordingly, the supporting layer pattern 152 prevents the second storage electrodes 162 having a highly stacked structure from inclining, tilting or slanting. Further, the supporting layer pattern 152 may be easily formed by a simple patterning process.

Referring again to FIG. 1, a dielectric layer 180 and a plate electrode 182 are sequentially formed on the storage electrode having the first and second storage electrodes 130 and 162, to form a capacitor 190.

Figure 18:
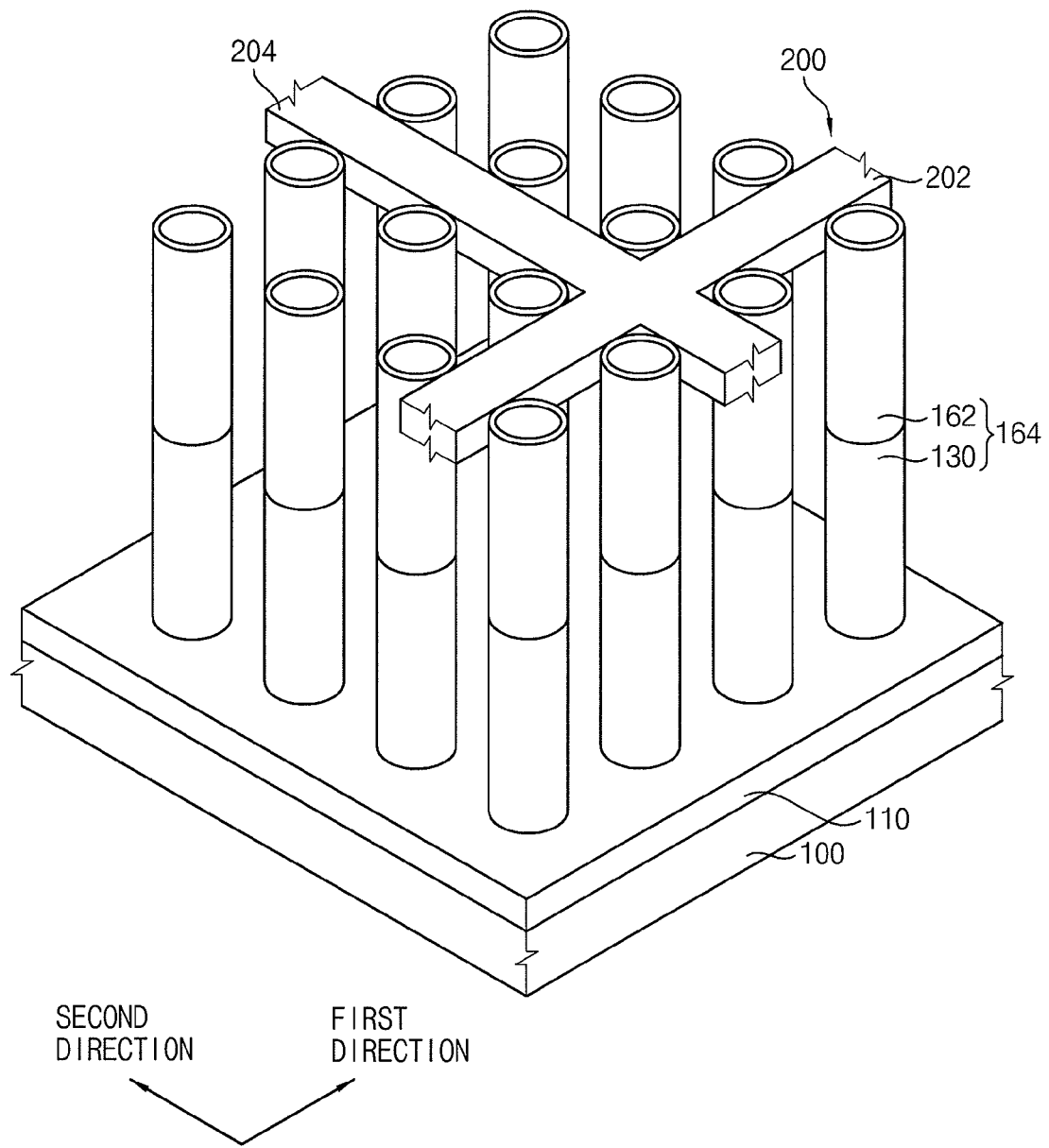
Figure 19:
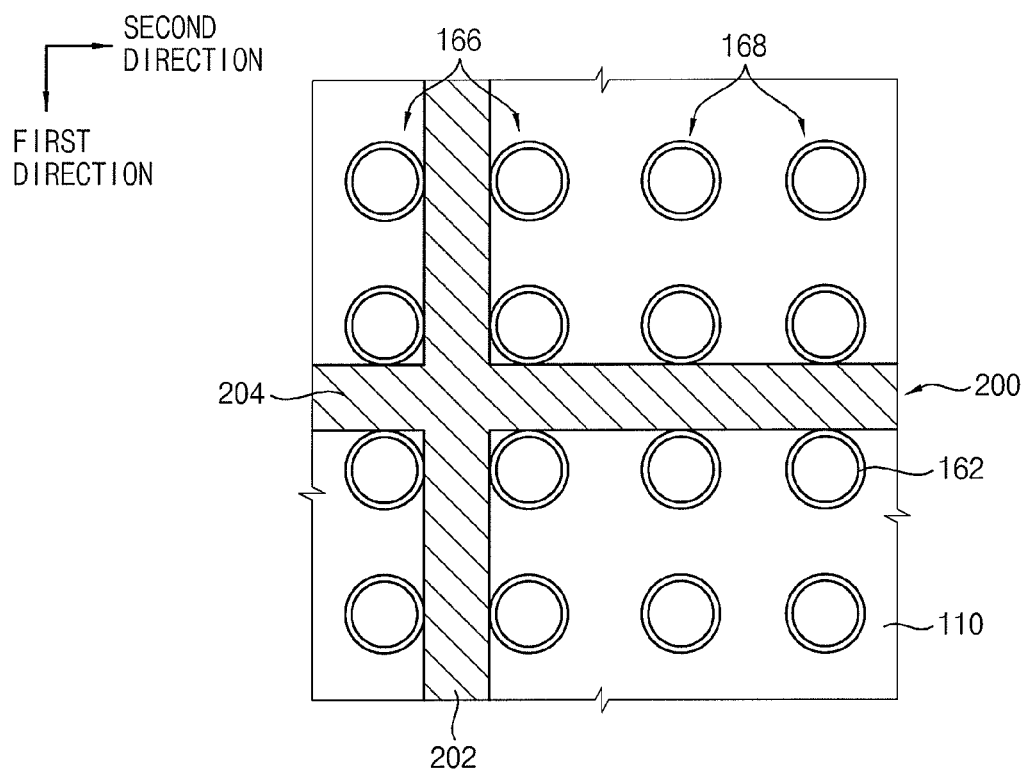
FIG. 19 is a plan view of FIG. 18.

FIG. 18 is a perspective view illustrating a storage electrode of a capacitor in accordance with an example embodiment. FIG. 19 is a plan view of FIG. 18.

The capacitor of the present embodiment is substantially the same as in the embodiment described in connection with FIGS. 1-17 except a supporting layer pattern for supporting a storage electrode has a different configuration. The same reference numerals will be used to refer to the same or like parts as those described in the embodiment described in connection with FIGS. 1-17.

Referring to FIGS. 18 and 19, a capacitor according to an example embodiment includes storage electrodes 164 having a plurality of first and second storage electrodes 130 and 162 formed on a substrate 100, a supporting layer pattern 200 for supporting the storage electrodes 164, a dielectric layer formed on the storage electrodes 164 and a plate electrode formed on the dielectric layer.

The first and second storage electrodes 130 and 162 may be arranged along lines parallel with a first direction and along lines parallel with a second direction different from the first direction. The second storage electrodes 162 may include a first group 166 of the second storage electrodes and a second group 168 of the second storage electrodes.

The first group 166 of the second storage electrodes is arranged repeatedly along adjacent first and second lines parallel with the first direction. The second group 168 of the second storage electrodes 168 is arranged repeatedly along adjacent third and fourth lines parallel with the first direction.

Alternatively, the first group 166 of the second storage electrodes may be arranged repeatedly along first and second lines parallel with the second direction, and the second group 168 of second storage electrodes may be arranged repeatedly along third and fourth lines parallel with the second direction.

In an example embodiment, the supporting layer pattern 200 includes a first supporting layer pattern 202 and a second supporting layer pattern 204.

The first supporting layer pattern 202 extends in a direction parallel with the first direction between the first group 166 of the adjacent second storage electrodes. The first supporting layer pattern 202 contacts outer surfaces of the first group 166 of the second storage electrodes.

The second supporting layer pattern 204 extends in a direction parallel with the second direction between the adjacent second storage electrodes 162. The second supporting layer pattern 204 contact outer surfaces of the second storage electrodes 162.

The first supporting layer pattern 202 intersects with the second supporting layer pattern 204. Accordingly, the intersecting first and second supporting layer patterns 202 and 204 firmly support the second storage electrodes 162 having highly stacked structures.

A method of forming a supporting layer pattern of a capacitor in accordance with an example embodiment will be explained.

Figure 20:
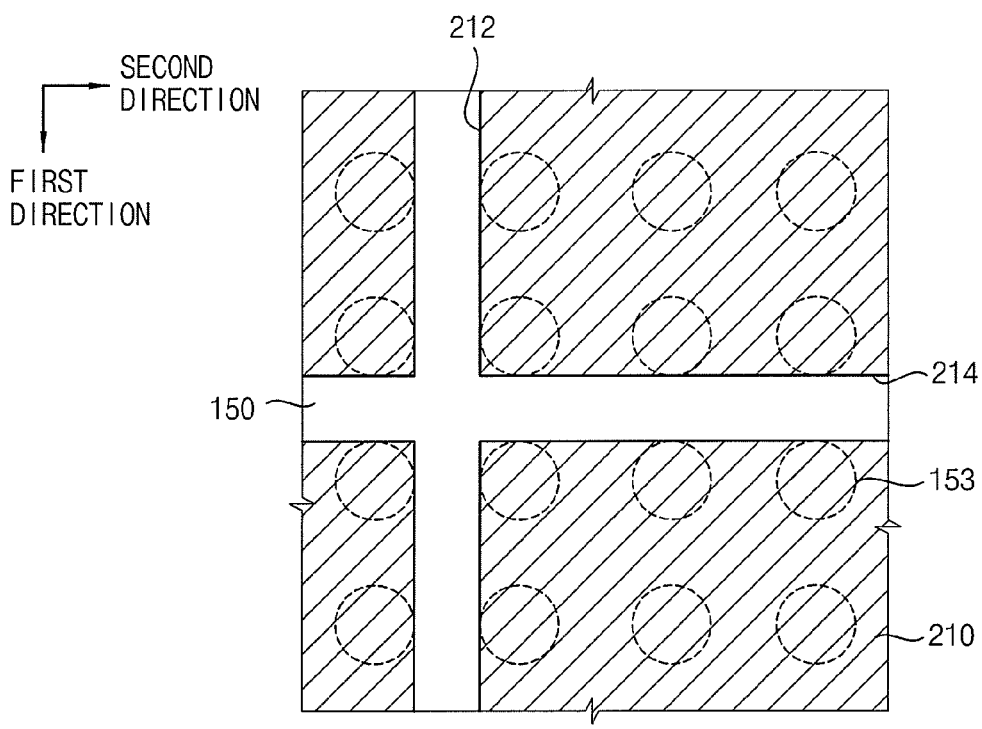
FIG. 20 is a plan view illustrating a method of forming the supporting layer pattern in FIG. 18.

FIG. 20 is a plan view for illustrating a method of forming the supporting layer pattern in FIG. 18.

First, as illustrated in FIG. 9, the second mold layer 140 and the supporting layer 150 are formed on the first mold layer pattern 124 in which the first storage electrodes 130 are formed.

Referring to FIG. 20, the supporting layer 150 is patterned to form a supporting layer pattern 200 having first and second supporting layer patterns 202, 204 on the second mold layer 140.

In an example embodiment, a photoresist pattern 210 is formed on the supporting layer 150. The supporting layer 150 is patterned using the photoresist pattern 210 as an etching mask to form the supporting layer pattern 200. The photoresist pattern 210 includes an opening 212 and an opening 214.

The opening 212 has a linear shape extending in a direction parallel with the first direction. The opening 214 has a linear shape extending in a direction parallel with the second direction different from the first direction. The opening 212 intersects with the opening 214.

The opening 212 extends in a direction parallel with the first direction between regions 153 where the adjacent second storage electrodes are to be formed. The opening 212 respectively faces portions of the regions 153 where the adjacent second storage electrodes are to be formed.

The opening 214 extends in a direction parallel with the second direction between regions 153 where the adjacent second storage electrodes are to be formed. The opening 214 respectively faces portions of the regions 153 where the adjacent second storage electrodes are to be formed.

Thus, the first and second supporting layer patterns 202, 204 intersect with each other to form the supporting layer pattern 200 on the second mold layer 140.

Figure 21:
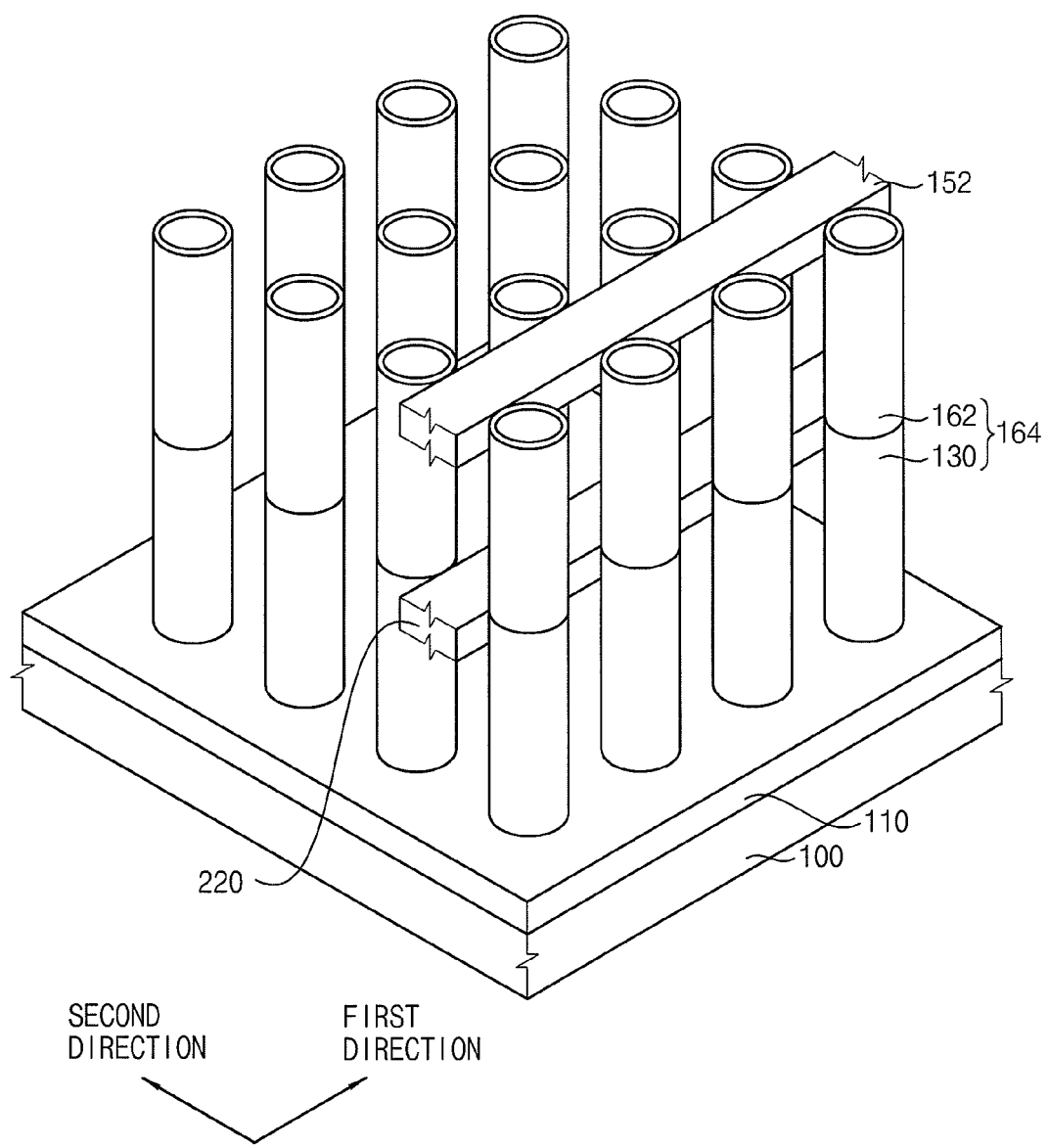
FIG. 21 is a perspective view illustrating a storage electrode of a capacitor in accordance with an example embodiment.
Figure 22:
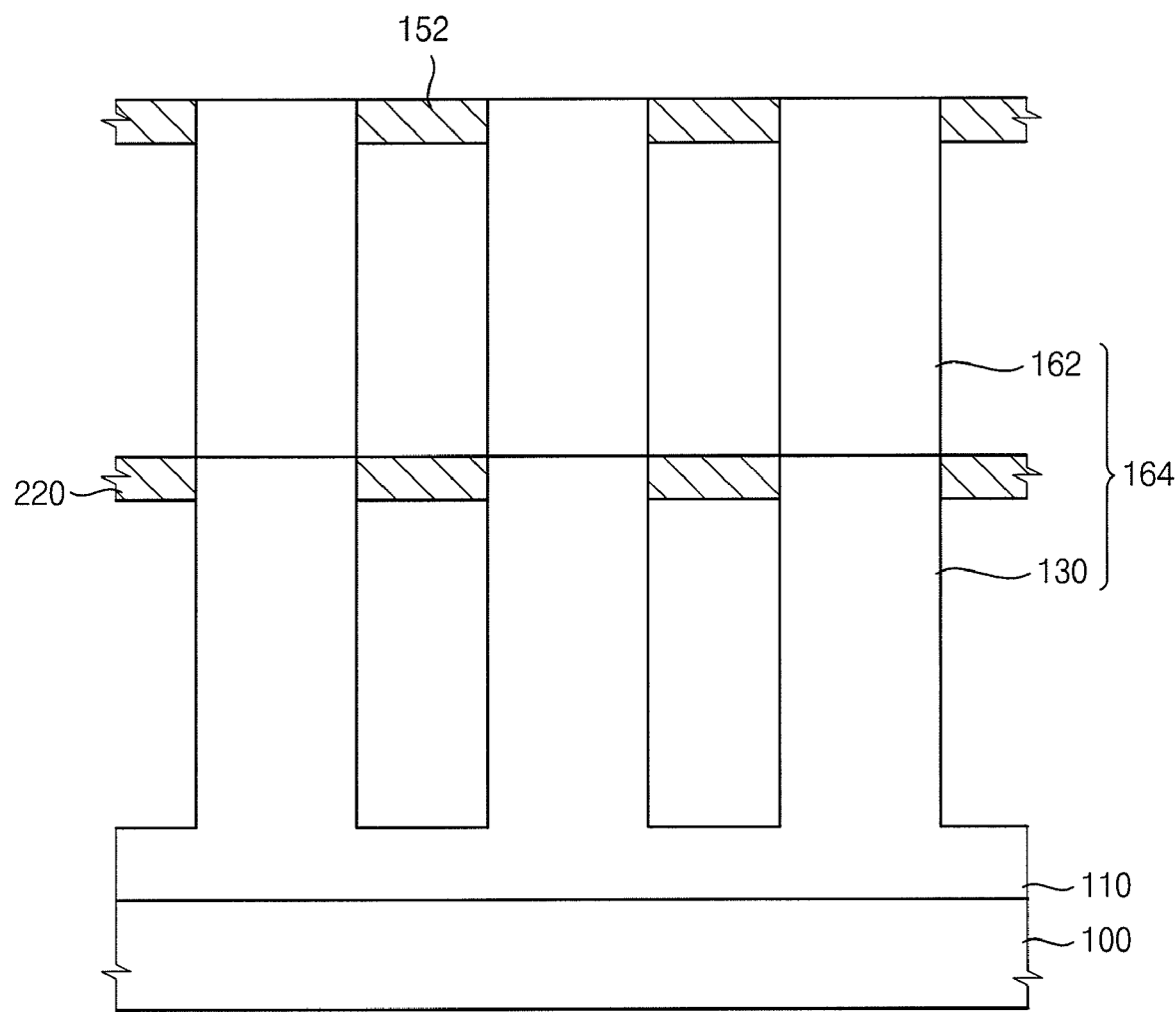
FIG. 22 is a side view of FIG. 21.

FIG. 21 is a perspective view illustrating a storage electrode of a capacitor in accordance with an example embodiment. FIG. 22 is a side view of FIG. 21.

The capacitor of the present embodiment is substantially the same as in the embodiment described in connection with FIGS. 1-17 except with respect to a supporting layer pattern for supporting a plurality of first and second storage electrodes. Thus, the same reference numerals are used to refer to the same or like parts as those described in the embodiment described in connection with FIGS. 1-17.

Referring to FIGS. 21 and 22, a capacitor according to an example embodiment includes storage electrodes 164 having a plurality of first and second storage electrodes 130 and 162 formed on a substrate 100, supporting layer patterns 220 and 152 for supporting the storage electrodes 164, a dielectric layer formed on the storage electrodes 164 and a plate electrode formed on the dielectric layer.

The first and second storage electrodes 130 and 162 are arranged along lines parallel with a first direction and along lines parallel with a second direction different from the first direction.

In an example embodiment, the supporting layer pattern 220 extends in a direction parallel with the first direction between the adjacent first storage electrodes 130. The supporting layer pattern 220 contacts outer surfaces of the first storage electrodes 130.

The supporting layer pattern 220 is positioned to make contact with upper portions of the first storage electrodes 130. Alternatively, the third supporting layer pattern 220 may be positioned to make contact with the middle portions or lower portions of the first storage electrodes 130.

The supporting layer pattern 152 extends in a direction parallel with the first direction between the adjacent second storage electrodes 162. The supporting layer pattern 152 contacts outer surfaces of the second storage electrodes 162. Alternatively, the supporting layer pattern 152 may extend in a direction parallel with the second direction between the adjacent second storage electrodes 162.

Accordingly, the supporting layer pattern 220 supports the first storage electrodes 130 and the supporting layer pattern 152 supports the second storage electrodes 162. Thus, the third and fourth supporting layer patterns 220 and 152 may firmly support the storage electrode 162 having the first and second storage electrodes 130 and 162 stacked on each other.

A method of forming the storage electrode in FIG. 21 will be explained.

FIGS. 23 to 28 are views illustrating a method of forming the supporting layer pattern 220 in FIG. 21.

As illustrated in FIG. 4, the insulating interlayer 110 having a plurality of the contact pads 112 is formed on the substrate 100.

Figure 23:
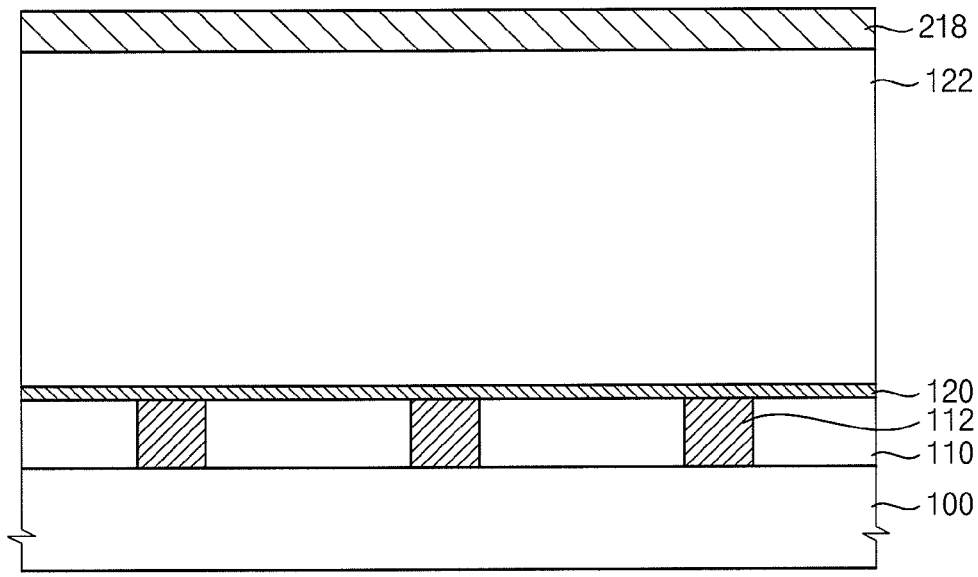
FIGS. 23 to 28 are views illustrating a method of forming the third supporting layer pattern in FIG. 21.

Referring to FIG. 23, the etch stop layer 120, the first mold layer 122 and a first supporting layer 218 are sequentially formed on the insulating interlayer 110. The first mold layer may include, for example, an insulating material including oxide. In example embodiments, the first mold layer may be used to form the first storage electrode.

The first supporting layer 218 may include a material having an etch selectivity with respect to the first mold layer 122 and a following second mold layer. The first supporting layer 218 may include, for example, an insulating material including nitride. For example, the first supporting layer 218 may include silicon nitride.

Figure 24:
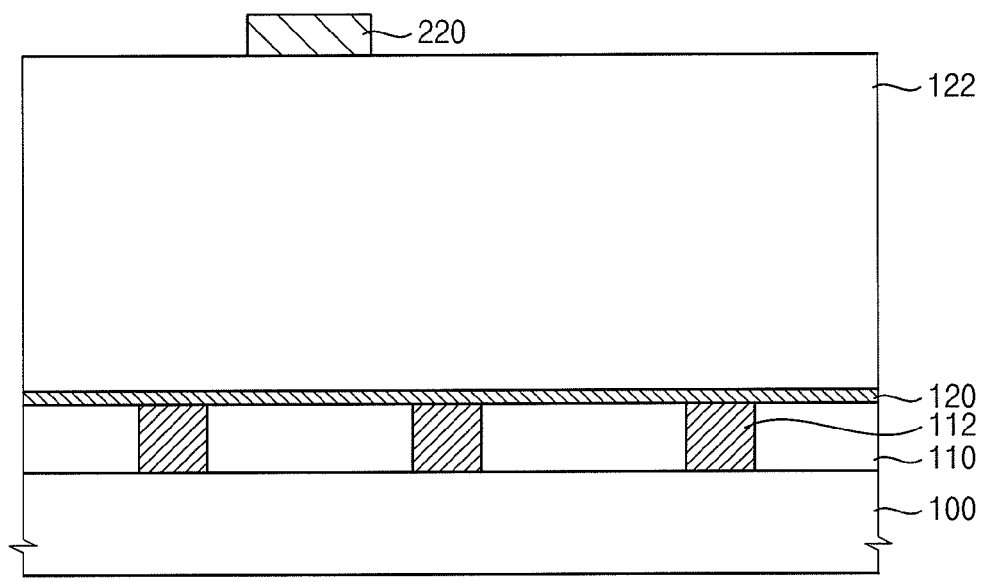

Referring to FIG. 24, the first supporting layer 218 is patterned to form a supporting layer pattern 220 on the first mold layer 122.

In an example embodiment, a photoresist pattern (not illustrated) may be formed on the first supporting layer 218, and the first supporting layer 218 may be etched using the photoresist pattern as an etching mask to form the supporting layer pattern 220. Then, the photoresist pattern may be removed from the first mold layer 122.

Figure 25:
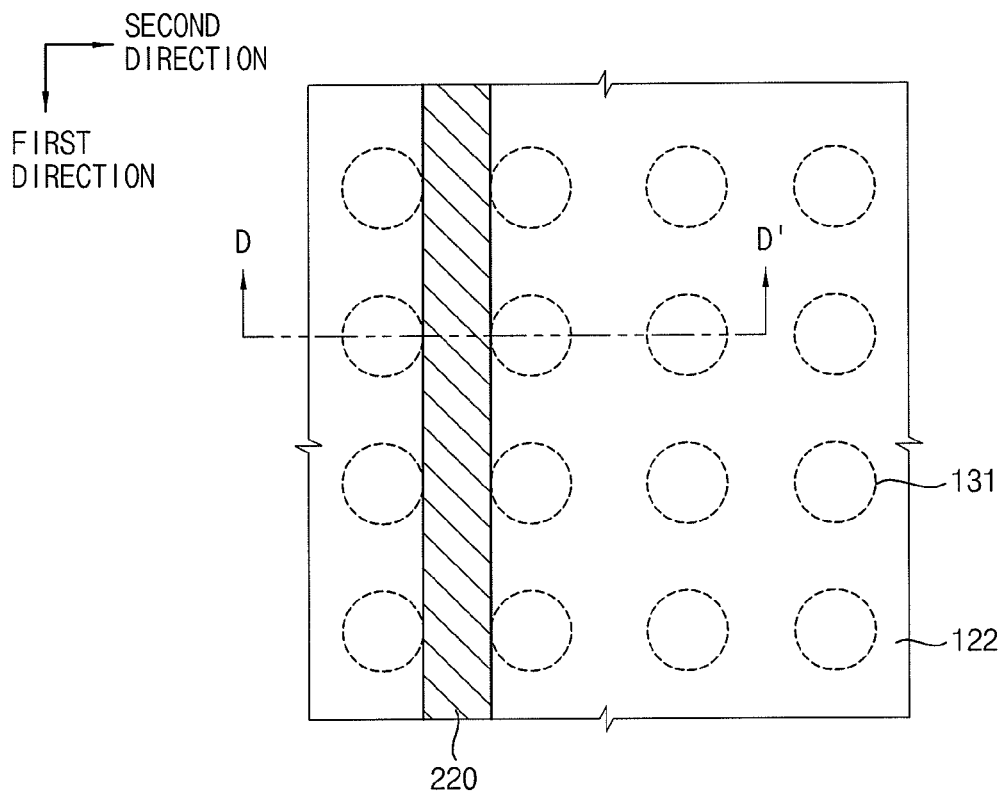

FIG. 25 is a plan view illustrating the supporting layer pattern 220. FIG. 24 is a cross-sectional view taken along the line D-D' in FIG. 25.

Referring to FIG. 25, in an example embodiment, the supporting layer pattern 220 has a linear shape extending in a direction parallel with the first direction. The supporting layer pattern 220 extends in the direction parallel with the first direction between regions 131 where the adjacent first storage electrodes are to be formed. The supporting layer pattern 220 faces portions of the regions 131 where the adjacent first storage electrodes are to be formed.

Figure 26:
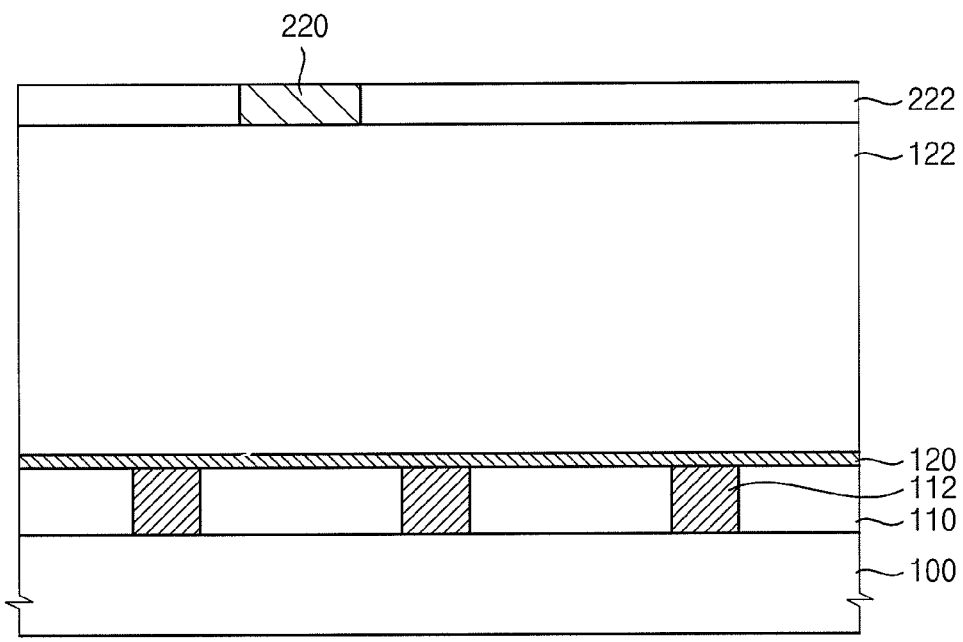

Referring to FIG. 26, a mold layer 222 is formed on the first mold layer 122. The mold layer 222 may have a planarized upper surface formed by a planarization process. In an example embodiment, an upper portion of the mold layer 222 is removed to have the upper surface coplanar with an upper surface of the supporting layer pattern 220. The mold layer 222 may include, for example, an insulating material including oxide.

Figure 27:
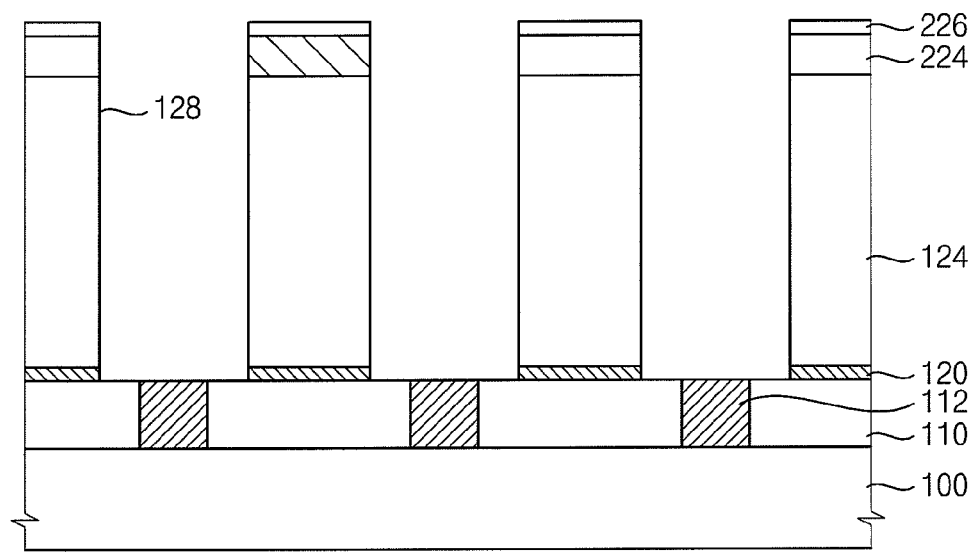

Referring to FIG. 27, the mold layer 222 and the first mold layer 122 are patterned to form mold layer patterns 224 and 124 having openings 128 that define regions where the first storage electrodes are to be formed. The openings 128 expose upper surfaces of the contact pads 112.

In an example embodiment, a mask layer (not illustrated) is formed using a material having an etch selectivity with respect to the mold layers 122 and 222. A photoresist pattern (not illustrated) is formed on the mask layer to define the regions where the first storage electrodes are to be formed. For example, the third mask layer may include polysilicon, nitride, etc.

The mask layer is etched using the photoresist pattern as an etching mask to form a mask 226 on the mold layer 222. The mask defines the regions where the first storage electrodes are to be formed. Then, the photoresist pattern is removed by an ashing and strip processes.

Then, the mold layer 222 and the mold layer 122 are partially etched using the mask 226 to form the mold layer patterns 224 and 124 having the openings 128 that expose the regions where the first storage electrodes are to be formed.

Figure 28:
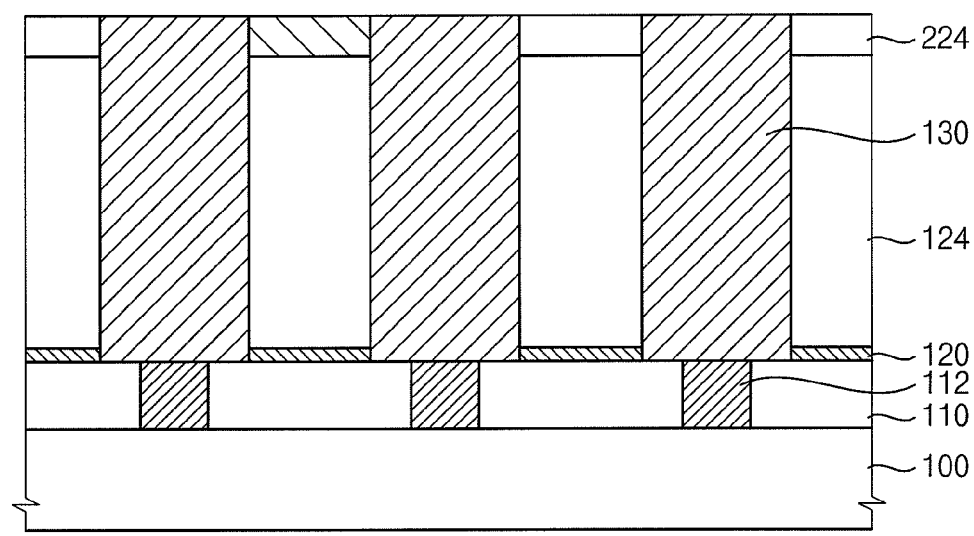

Referring to FIG. 28, the openings 128 are filled with a conductive material to form a plurality of first storage electrodes 130. Examples of the conductive material may be titanium nitride (TiN), titanium nitride (TiN)/polysilicon, titanium nitride (TiN)/silicon nitride (SiN)/polysilicon, titanium nitride (TiN)/tungsten (W), titanium nitride (TiN)/tantalum oxide (TaO), etc.

In an example embodiment, the openings 128 are filled using titanium nitride (TiN) to form the first storage electrodes 130. Alternatively, a first conductive material including titanium nitride (TiN) is formed conformally on an inner surface of the opening 128 and then a second conductive material including silicon nitride (SiN), tungsten (W) or tantalum oxide (TaO) is formed on the first conductive material to form the first storage electrodes 130.

Alternatively, the first conductive material including titanium nitride (TiN) is conformally on the inner surface of the opening 128 and then the second conductive material including silicon nitride (SiN) is formed on the first conductive material. Then, a third conductive material including polysilicon is formed on the second conductive material to form the first storage electrodes 130.

Then, the conductive material and the mask 226 are removed from the mold layer pattern 224. The conductive material and the mask 226 may be removed by a chemical mechanical polishing process, an etch-back process, etc.

Accordingly, the openings 128 of the mold layer patterns 124 and 224 are completely filled with the conductive material to form the stack type first storage electrodes 130.

Then, as described above with reference to FIGS. 9 to 17, after the second storage electrode 162 is formed on the first storage electrode 130, the mold layer patterns 124, 142, 156 an 224 are removed to form the supporting layer pattern 222 for supporting the first storage electrodes 130 and the supporting layer pattern 152 for supporting the second storage electrodes 162.

Figure 29:
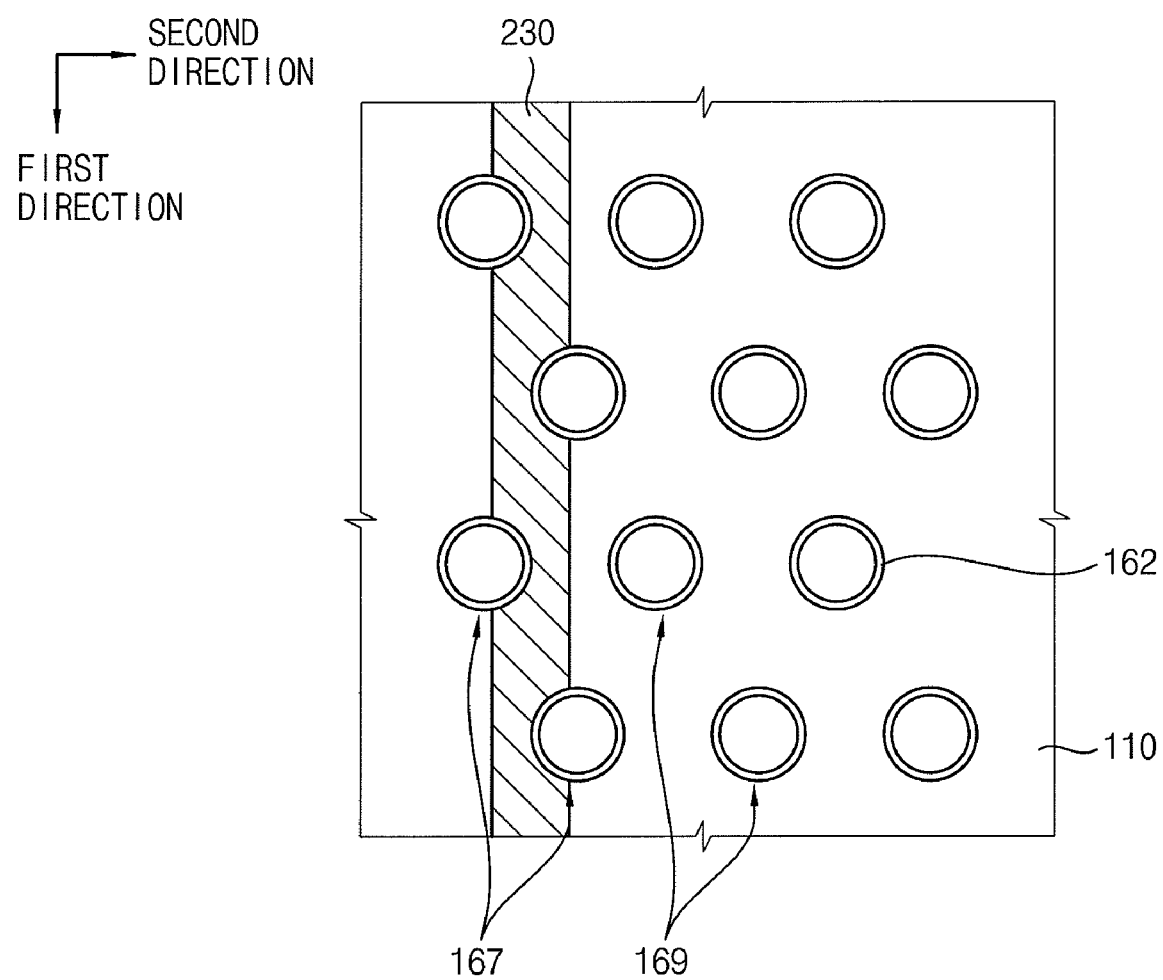
FIG. 29 is a plan view illustrating a storage electrode of a capacitor in accordance with an example embodiment.

FIG. 29 is a plan view illustrating a storage electrode of a capacitor in accordance with an example embodiment.

The capacitor of the present embodiment is substantially the same as in the embodiment described in connection with FIGS. 1-17 except with respect to an arrangement of storage electrodes and a shape of a supporting layer pattern. Thus, the same reference numerals will be used to refer to the same or like parts as those described in the embodiment described in connection with FIGS. 1-17.

Referring to FIG. 29, a capacitor according to an example embodiment includes storage electrodes 164 having a plurality of first storage electrodes and second storage electrodes 162 and a supporting layer pattern 230 for supporting the storage electrodes.

The second storage electrodes 162 are stacked on the first storage electrodes. Accordingly, the second storage electrodes 162 are arranged similarly to the first storage electrodes.

The second storage electrodes 162 are arranged along lines parallel with a first direction and along lines parallel with a second direction different from the first direction. For example, the first direction may be perpendicular to the second direction.

The second storage electrodes 162 may include a first group 167 of the second storage electrodes and a second group 169 of the second storage electrodes. The first group 167 of the second storage electrodes is arranged repeatedly along adjacent first and second lines parallel with the first direction. The second group 169 of the second storage electrodes is arranged repeatedly along adjacent third and fourth lines parallel with the first direction.

In an example embodiment, the second storage electrodes 162 along the first line may be arranged alternatively with the second storage electrodes 162 along the second line.

Accordingly, the first group 167 of the second storage electrodes along the first and second lines is arranged in a staggered or zigzag configuration. The second group 169 of the second storage electrodes along the third and fourth lines is also arranged in a staggered or zigzag configuration.

In an example embodiment, the supporting layer pattern 230 extends in a direction parallel with the first direction between the first group 167 of the adjacent second storage electrodes. The supporting layer pattern 230 contacts with outer surfaces of the first group 167 of the second storage electrodes.

As illustrated in FIG. 29, a contact area between the supporting layer pattern 230 and the outer surfaces of the second storage electrodes 162 is greater than a contact area between the supporting layer pattern 152 and the second storage electrodes in FIG. 3. The contact area between the supporting layer pattern 230 and the second storage electrodes 162 may be increased. Accordingly, the supporting layer patterns 230 firmly support the second storage electrodes 162 having highly stacked structures.

As mentioned above, a capacitor according to an example embodiment includes a storage electrode having different types of first and second storage electrodes. A supporting layer pattern may extend between the second storage electrodes to contact outer surfaces of the second storages electrodes.

Accordingly, the supporting layer pattern may prevent the highly stacked second storage electrodes from leaning or slanting. Further, the storage electrode may provide improved high capacitance due to an expanded surface area, and the supporting layer pattern may be easily formed by a simple patterning process.

The foregoing is illustrative of example embodiments and is to not be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is to not be construed as limited to the specific example embodiments disclosed, and that modifications to the disclosed example embodiments, as well as other example embodiments, are intended to be included within the scope of the appended claims.

What is claimed is:

1. A capacitor, comprising:
a substrate having a plurality of contact pads formed therein;
a plurality of first storage electrodes arranged respectively along first and second lines parallel with a first direction to form respective electrode columns in the first and second lines and electrically connected to the contact pads, respectively;
a plurality of second storage electrodes respectively stacked on the first storage electrodes;
a first supporting layer pattern extending between the first and second lines in a direction parallel with the first direction, positioned between adjacent second storage electrodes and contacting the adjacent second storage electrodes;
a second supporting layer pattern at least one of extending in a second direction different from the first direction or positioned under the first supporting layer pattern;
a dielectric layer on the first and second storage electrodes; and
a plate electrode on the dielectric layer.

2. The capacitor of claim 1, wherein the second supporting layer pattern extends in the second direction different from the first direction, is positioned between adjacent second storage electrodes and contacts the adjacent second storage electrodes.

3. The capacitor of claim 2, wherein the first supporting layer pattern and the second supporting layer pattern intersect with each other.

4. The capacitor of claim 1, wherein the second supporting layer pattern extends between adjacent first storage electrodes and contacts the adjacent first storage electrodes.

5. The capacitor of claim 4, wherein the second supporting layer pattern is positioned under the first supporting layer pattern and extends in the first direction.

6. The capacitor of claim 4, wherein the second supporting layer pattern extends in the second direction different from the first direction.

7. The capacitor of claim 1, wherein the first storage electrode is a stack type storage electrode including a solid structure and the second storage electrode is a cylinder type storage electrode including an opening therein.

8. The capacitor of claim 1, wherein the first storage electrode comprises titanium nitride (TiN), titanium nitride (TiN) and polysilicon, titanium nitride (TiN) and silicon nitride (SiN) and polysilicon, titanium nitride (TiN) and tungsten (W), or titanium nitride (TiN) and tantalum oxide (TaO).

9. A capacitor, comprising:
a substrate;
a plurality of first storage electrodes arranged on the substrate and respectively along first and second lines parallel with a first direction to form respective electrode columns in the first and second lines;
a plurality of second storage electrodes respectively stacked on the first storage electrodes;
a first supporting layer pattern extending between the first and second lines between adjacent second storage electrodes and contacting the adjacent second storage electrodes;
a second supporting layer pattern at least one of extending in a second direction different from the first direction or positioned under the first supporting layer pattern;
a dielectric layer on the first and second storage electrodes; and
a plate electrode on the dielectric layer.

* * * * *